US012706164B2

(12) United States Patent
An et al.

(10) Patent No.: US 12,706,164 B2
(45) Date of Patent: Aug. 11, 2026

(54) MEMORY DEVICE AND METHOD OF OPERATING WORDLINES

(71) Applicant: Samsung Electronics Co., Ltd., Suwon-si (KR)

(72) Inventors: Jongho An, Suwon-si (KR); Daehan Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 18/599,471

(22) Filed: Mar. 8, 2024

(65) Prior Publication Data

US 2024/0312540 A1 Sep. 19, 2024

(30) Foreign Application Priority Data

Mar. 13, 2023 (KR) ........................ 10-2023-0032817

(51) Int. Cl.
*G11C 16/34* (2006.01)
*G11C 16/32* (2006.01)

(52) U.S. Cl.
CPC .......... *G11C 16/3459* (2013.01); *G11C 16/32* (2013.01); *G11C 16/3418* (2013.01)

(58) Field of Classification Search
CPC . G11C 16/3459; G11C 16/32; G11C 16/3418; G11C 11/5628; G11C 16/08; G11C 16/10; G11C 29/025; G11C 2029/1202
See application file for complete search history.

(56) References Cited

U.S. PATENT DOCUMENTS

| | | | | |
|---|---|---|---|---|
| 7,679,133 | B2 | 3/2010 | Son et al. | |
| 8,514,630 | B2 | 8/2013 | Huynh et al. | |
| 8,553,466 | B2 | 10/2013 | Han et al. | |
| 8,559,235 | B2 | 10/2013 | Yoon et al. | |
| 8,634,264 | B2 * | 1/2014 | Yamada | G11C 29/025 365/201 |
| 8,654,587 | B2 | 2/2014 | Yoon et al. | |
| 9,899,098 | B1 * | 2/2018 | Kaneko | G11C 16/3459 |
| 10,008,276 | B2 | 6/2018 | Huynh et al. | |
| 10,714,205 | B1 | 7/2020 | Fang et al. | |

(Continued)

FOREIGN PATENT DOCUMENTS

| | | |
|---|---|---|
| KR | 10-2022-0019547 A | 2/2022 |
| KR | 10-2022-0059039 A | 5/2022 |

*Primary Examiner* — Uyen Smet
(74) *Attorney, Agent, or Firm* — Harness, Dickey & Pierce, P.L.C.

(57) ABSTRACT

A memory device includes a leakage detector connected to each of a plurality of word lines and configured to obtain a program voltage and perform a leakage detection operation, and a control circuit configured to control a row decoder, a voltage generator, and the leakage detector, and to perform a leakage detection operation on the plurality of word lines. The control circuit may execute a loop including a first section and a second section, may control the program voltage not to be applied to the designated word line after a time in the first section, may use the leakage detector in response to execution of at least one designated loop to measure a voltage charged in the designated word line after the second section of the designated loop is terminated, and may perform the leakage detection operation on the basis of the measured voltage.

20 Claims, 15 Drawing Sheets

(56) References Cited

U.S. PATENT DOCUMENTS

| | | | |
|---|---|---|---|
| 11,404,138 | B2 | 8/2022 | Lakshminarayana Addagalla et al. |
| 11,475,956 | B2 | 10/2022 | Kim et al. |
| 2011/0233648 | A1 | 9/2011 | Seol et al. |
| 2012/0275228 | A1 | 11/2012 | Lu |
| 2015/0255162 | A1 | 9/2015 | Shibazaki et al. |
| 2016/0018454 | A1 * | 1/2016 | Jeon ................ G11C 29/12005 324/509 |
| 2019/0018597 | A1 * | 1/2019 | Zhang .................. G06F 3/0611 |
| 2022/0044758 | A1 | 2/2022 | Son et al. |

* cited by examiner

Figure 2:
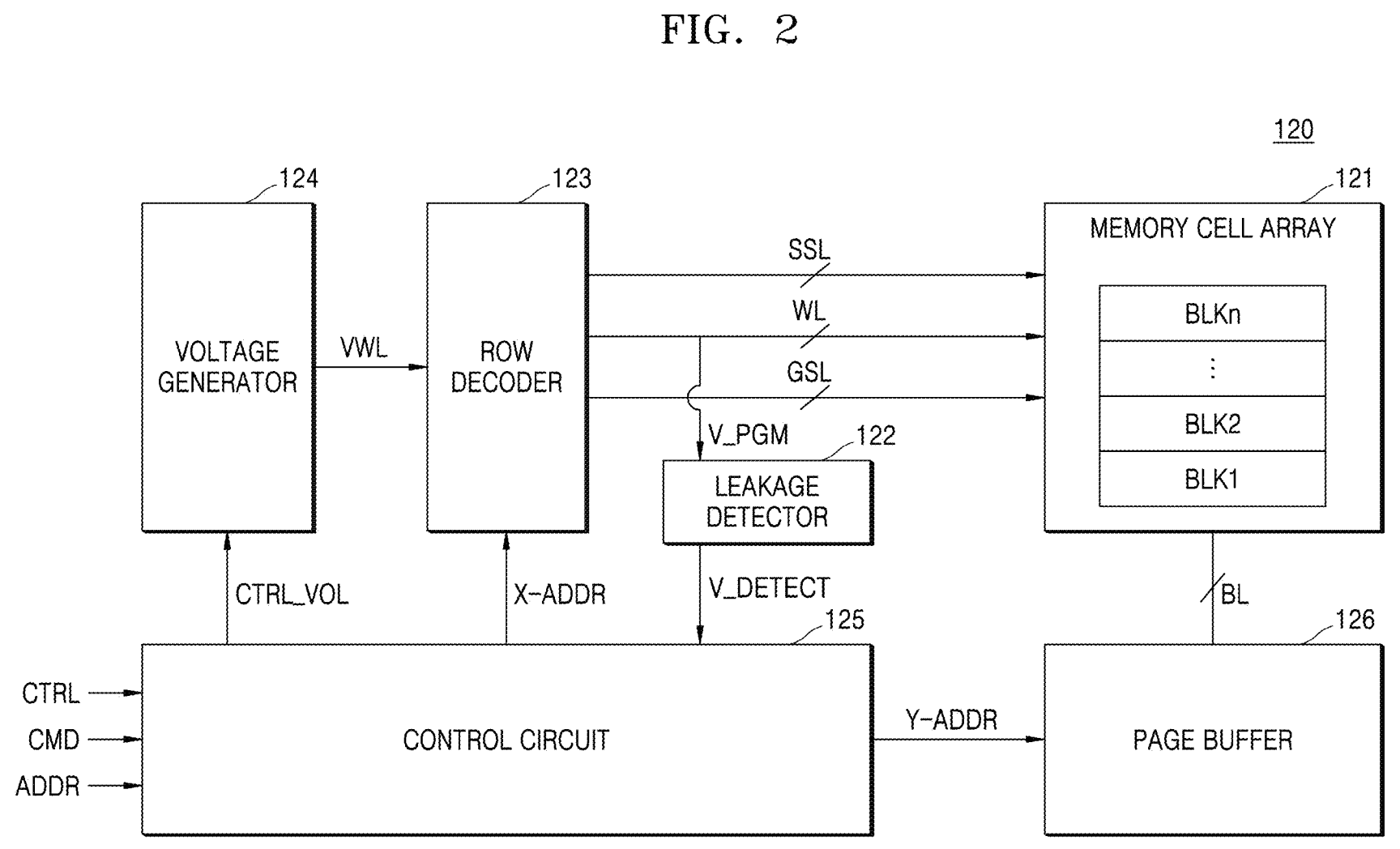

121 MEMORY CELL ARRAY

BLKn

...

BLK2

BLK1

BL

126 PAGE BUFFER

SSL

WL

GSL

122 LEAKAGE DETECTOR

V_PGM

V_DETECT

Y-ADDR

125 CONTROL CIRCUIT

123 ROW DECODER

X-ADDR

VWL

124 VOLTAGE GENERATOR

CTRL_VOL

CTRL

CMD

ADDR

Figure 9:
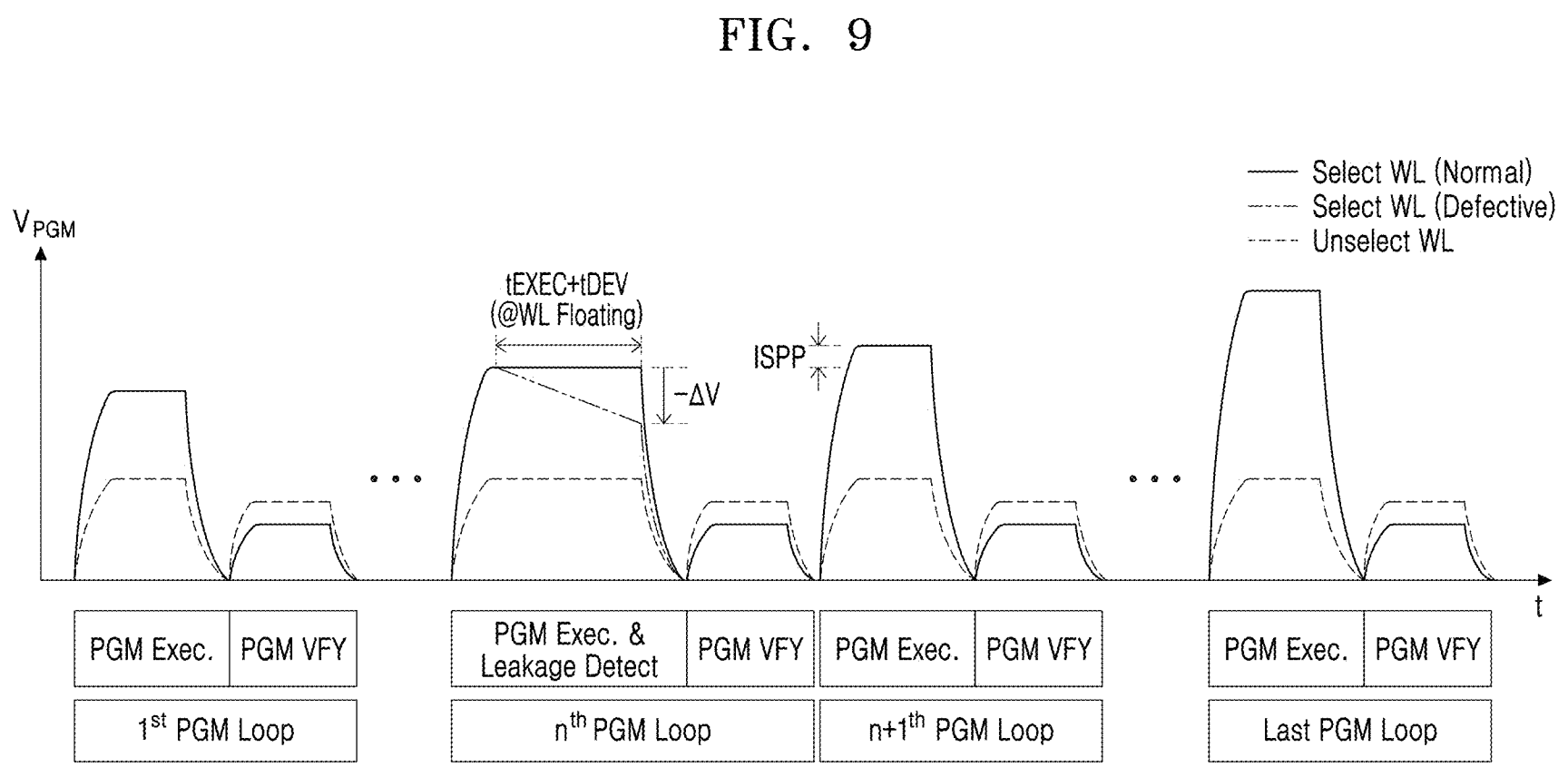

Select WL (Normal)
Select WL (Defective)
Unselect WL $V_{PGM}$ t tEXEC+tDEV
(@WL Floating)

−ΔV

ISPP

| PGM Exec. | PGM VFY | PGM Exec. & Leakage Detect | PGM VFY | PGM Exec. | PGM VFY | PGM Exec. | PGM VFY |
|---|---|---|---|---|---|---|---|
| 1st PGM Loop | | nth PGM Loop | | n+1th PGM Loop | | Last PGM Loop | |

MEMORY DEVICE AND METHOD OF OPERATING WORDLINES

CROSS-REFERENCE TO RELATED APPLICATION

This application is based on and claims priority under 35 U.S.C. § 119 to Korean Patent Application No. 10-2023-0032817, filed on Mar. 13, 2023, in the Korean Intellectual Property Office, the disclosure of which is incorporated by reference herein in its entirety.

BACKGROUND

Various example embodiments relate to a memory device, and more particularly, to a method of operating word lines and detecting a word line leakage voltage (and/or a leakage current) of a memory device.

Memory devices may be divided into volatile memory devices and non-volatile memory devices depending on whether or not stored data is lost when the power supply is interrupted. Nonvolatile memory devices include a flash memory device that may be electrically erased and programmed.

Nonvolatile memory devices may include a memory cell array including a plurality of memory blocks, and each of the plurality of memory blocks may include a plurality of word lines, e.g., corresponding to a plurality of rows. In this case, leakage may occur in a plurality of word lines due to deterioration of the nonvolatile memory device, and/or the like. Such leakage may cause malfunctions in program, read, and/or erase operations of nonvolatile memory devices. Therefore, it is necessary or desirable to develop a method capable of detecting leakage that may occur in an element in a nonvolatile memory device.

SUMMARY

Various example embodiments provide a method of operating the memory device including a method of detecting word line leakage in a memory device.

According to various example embodiments, there is provided a memory device including a memory cell array including a plurality of word lines, a voltage generator configured to generate a program voltage and a verification voltage, a row decoder configured to provide the program voltage and the verification voltage to a designated word line, a leakage detector connected to each of the plurality of word lines and configured to obtain the program voltage and to perform a leakage detection operation, and a control circuit configured to control the row decoder, the voltage generator, and the leakage detector, and to perform a leakage detection operation on the plurality of word lines. The control circuit may execute a loop including a first section that applies a program voltage to the designated word line and a second section that applies a verification voltage to the designated word line wherein in the loop, the program voltage applied to the designated word line gradually increases. The control circuit is configured to control the program voltage not to be applied to the designated word line after a time in the first section, and, in response to execution of a designated loop, to use the leakage detector to measure a voltage charged in the designated word line after the second section of the designated loop is terminated, and to perform the leakage detection operation on the basis of the measured voltage.

Alternatively or additionally according to various example embodiments, there is provided a word line operation method of a memory device including a plurality of word lines, the method including executing a loop including a first section that applies a program voltage to the word lines and a second section that applies a verification voltage to the word lines, wherein in the loop the program voltage applied to the word lines gradually increases. The method further includes controlling the program voltage not to be applied to the word lines after a time in the first section in response to execution of a designated loop, using a leakage detector to measure a voltage charged in the word lines after the second section of the designated loop is terminated, and performing a leakage detection operation on the basis of the measured voltage.

Alternatively or additionally according to various example embodiments, there is provided a memory system including a memory device including a memory cell array including a plurality of word lines, a voltage generator configured to generate a program voltage and a verification voltage, a row decoder configured to provide the program voltage and the verification voltage to a designated word line, and a leakage detector connected to each of the plurality of word lines and configured to perform a leakage detection operation by obtaining the program voltage, and a memory controller configured to transmit, to the memory device, a command indicating an operation of the memory device, wherein the memory device may execute a loop including a first section that applies a program voltage to the designated word line and a second section that applies a verification voltage to the designated word line, wherein in the loops, the program voltage applied to the designated word line gradually increases, to control the program voltage so as not to be applied to the designated word line after a time in the first section in response to execution of a designated loop, to measure a voltage charged in the designated word line after the second section of the designated loop is terminated by using the leakage detector, and to perform a leakage detection operation on the basis of the measured voltage.

BRIEF DESCRIPTION OF THE DRAWINGS

Various example embodiments will be more clearly understood from the following detailed description taken in conjunction with the accompanying drawings in which:

FIG. 2 is a block diagram illustrating a memory device according to some example embodiments;

FIG. 8 is a graph illustrating an example in which a memory device according to some example embodiments performs a word line leakage detection operation in a designated loop;

FIG. 9 is a graph illustrating an example in which a memory device according to some example embodiments performs a word line leakage detection operation in a designated loop;

DETAILED DESCRIPTION OF VARIOUS EXAMPLE EMBODIMENTS

Hereinafter, various embodiments of the inventive concept will be described in detail with reference to the accompanying drawings to easily implement the inventive concept by those skilled in the art.

Figure 1:
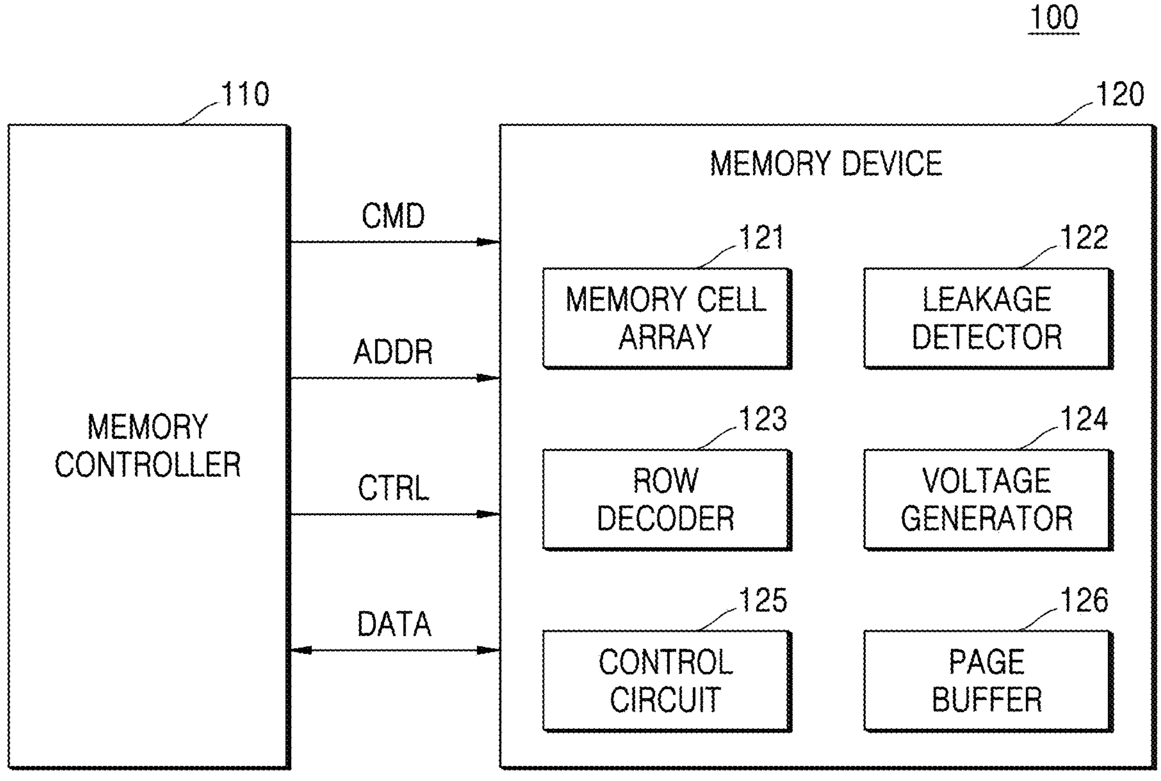
FIG. 1 is a block diagram illustrating a memory system according to some example embodiments.

FIG. 1 is a block diagram illustrating a memory system according to some example embodiments of the inventive concept.

Referring to FIG. 1, a memory system 100 may include a memory controller 110 and at least one memory device 120. In FIG. 1, a plurality of conceptual hardware configurations included in the memory system 100 are illustrated, but inventive concepts are not limited thereto, and other configurations not illustrated in FIG. 1 may be additionally included. The memory controller 110 may control the memory device 120 to write data to the memory device 120 in response to a write request from a host, or may control the memory device 120 to read data stored in the memory device 120 in response to a read request from the host.

In some example embodiments, the memory system 100 may be (or may include or be included in) an internal memory embedded in an electronic device. For example, the memory system 100 may be, include, or be included in one or more of an embedded Universal Flash Storage (UFS) memory device, an embedded multi-media card (eMMC), or a solid state drive (SSD). In some embodiments, the memory system 100 may be an external memory detachable from an electronic device. For example, the memory system 100 may be, may include, or be included in one or more of a UFS memory card, a compact flash (CF) card, a secure digital (SD) card, a Micro-SD card, a Mini-SD card, an Extreme Digital (xD), or Memory Stick.

The memory device 120 may perform one or more of an erase operation, a program, or a read operation under the control of the memory controller 110. The memory device 120 receives a command CMD and an address ADDR from the memory controller 110 through an input/output line, and transmits and receives data for a program operation or a read operation with the memory controller 110. In addition, the memory device 120 may receive a control signal CTRL from the memory controller 110 through a control line. The memory device 120 may include a memory cell array 121, a leakage detector 122, a row decoder 123, a voltage generator 124, a control circuit 125, and a page buffer 126.

The memory cell array 121 may include a plurality of memory blocks, and each of the plurality of memory blocks may include a plurality of memory cells, such as single-level cells (SLC) and/or multi-level cells (MLC) and/or triple-level cells (TLC) and/or a quad-level cell (QLC). Each of the plurality of memory blocks may include a plurality of word lines, and the plurality of word lines may connect between the plurality of memory cells.

The leakage detector 122 may be connected to the plurality of word lines, respectively. The leakage detector 122 may detect leakage of each word line based on the program voltage VPGM that is applied to each word line and may generate a detection voltage indicating whether leakage is detected, or an amount of leakage detected.

The row decoder 123 may select one of the plurality of memory blocks in response to the row address X-ADDR, and may select one of the word lines WL of the selected memory block. The row decoder 123 may output a voltage to the selected word line. The page buffer 126 may select some bit lines from among the bit lines BL in response to a column address Y-ADDR.

The voltage generator 124 may generate a program voltage and a verification voltage. The voltage generator 124 may provide the generated program voltage and the generated verification voltage to the row decoder 123. The voltage generator 124 may include one or more capacitors (not illustrated) that may help generate the program voltages and the verification voltages; example embodiments are not limited thereto.

The control circuit 125 may control the row decoder 123 and the voltage generator 124. The control circuit 125 may control the voltage generator 124 to adjust the voltage level of the program voltage and the verification voltage generated through the voltage generator 124. The control circuit 125 may control the row decoder 123 to determine whether to provide a voltage to the word lines WL through the row decoder 123.

The control circuit 125 may perform a leakage detection operation on a plurality of memory blocks. According to some example embodiments, the control circuit 125 may execute a loop including a first section for applying a program voltage to the designated word line, and a second section for applying a verification voltage to the designated word line in which the program voltage applied to the designated word line gradually increases, may control the program voltage not to be applied to the designated word line after a time such as a dynamically determined (or, alternatively, predetermined time) in the first section in response to execution of a designated loop, may measure a voltage charged in the designated word line after the second section of the designated loop is terminated by using the leakage detector, and may perform the leakage detection operation on the basis of the measured voltage.

As described above, the memory device 120 may perform a leakage detection operation, for example during a user operation, and may reduce or minimize performance degradation by performing the leakage detection operation only in one or more loops from among a plurality of loops. The leakage detection operation of the memory device 120 may be described in more detail with reference to FIG. 2 and/or the subsequent drawings.

Any or all of the elements described with reference to FIG. 1, e.g., as illustrated in the memory device 120, may communicate with any or all other elements described with reference to FIG. 1, e.g., as illustrated in the memory device

120. For example, any element may engage in one-way and/or two-way and/or broadcast communication with any or all other elements in FIG. 1, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

FIG. 2 is a block diagram illustrating a memory device according to some example embodiments.

Referring to FIG. 2, the memory device 120 may include a memory cell array 121, a leakage detector 122, a row decoder 123, a voltage generator 124, a control circuit 125, and a page buffer 126. Although not shown in FIG. 2, the memory device 120 may further include other components such as an input/output interface.

The memory cell array 121 may be connected to the page buffer 126 through bit lines BL, and may be connected to the row decoder 15 through word lines WL, string selection lines SSL, and ground selection lines GSL. The memory cell array 121 may include a plurality of memory blocks BLK1 to BLKn (where n is a natural number of 2 or more), and each of the plurality of memory blocks BLK1 to BLKn may include a plurality of memory cells. For example, the memory cells may be or include flash memory cells such as SLC cells and/or MLC cells and/or TLC cells and/or as QLC cells. Hereinafter, various example embodiments will be described with reference to a case where a plurality of memory cells are NAND flash memory cells. However, inventive concepts are not limited thereto, and in some embodiments, the plurality of memory cells may be resistive memory cells such as one or more of resistive RAM (ReRAM), phase change RAM (PRAM), or magnetic RAM (MRAM).

In one or more example embodiments, the memory cell array 121 may include a three-dimensional (3D) memory cell array, the 3D memory cell array may include a plurality of NAND strings, and each NAND string may include memory cells respectively connected to word lines stacked vertically on a substrate, which will be described later with reference to FIG. 3. U.S. Pat. Nos. 7,679,133, 8,553,466, 8,654,587, and 8,559,235, and US Patent Application Publication No. 2011/0233648 describe relevant configurations for a three-dimensional memory array in which a three-dimensional memory array includes a plurality of levels and word lines and/or bit lines are shared between the levels, and are each incorporated by reference herein. However, inventive concepts are not limited thereto, and in some example embodiments, the memory cell array 121 may include a two-dimensional memory cell array, and the two-dimensional memory cell array may include a plurality of NAND strings arranged in the row and column directions. The memory cell array 121 may additionally or alternatively include redundancy cells and/or dummy cells; example embodiments are not limited thereto.

The leakage detector 122 may include a first capacitor, a second capacitor, a reference voltage generator, and a comparator (not illustrated in FIG. 2). The comparator may receive, as inputs, a first input voltage in which the program voltage is dropped based on the capacitance ratio between the first and second capacitors and a second input voltage generated by the reference voltage generator, and compares the first input voltage with the second input voltage to generate a detection voltage indicating a comparison result. For example, when a difference between the first input voltage and the second input voltage is greater than a particular value (such as a dynamically determined or predetermined value), the leakage detector 122 may determine that word line leakage has occurred and generate a first level detection voltage corresponding to word line leakage detection. When a difference between the first input voltage and the second input voltage is less than the particular value, the leakage detector 122 may determine that word line leakage has not occurred and may generate a second level detection voltage.

In response to the row address X-ADDR, the row decoder 123 may select one of the plurality of memory blocks, may select one of the word lines WL of the selected memory block, and may select one of the plurality of string selection lines SSL. The page buffer 126 may select some bit lines from among the bit lines BL in response to a column address Y-ADDR. For example, the page buffer 126 operates as a write driver and/or a sense amplifier according to an operation mode.

The voltage generator 124 may generate a voltage VWL supplied to the memory cell array 121. The voltage generator 124 may generate various types of voltages for performing one or more of a program, read, and erase operations on the memory cell array 121 based on the voltage control signal CTRL_VOL. For example, the voltage generator 124 may generate one or more of a program voltage, a verification voltage, a read voltage, a pass voltage, an erase voltage, an erase verification voltage, and the like.

According to one or more example embodiments, because the word line is long, voltage VWL may be transmitted to the word line far from the voltage generator 124 (close to the memory cell array 121) later than the word line near the voltage generator 124. In some example embodiments, there may be voltage drop, e.g., current-resistance (IR) drop, along the word line.

The control circuit 125 receives a control signal CTRL, a command CMD, and an address ADDR from the memory controller 110, receives a detection voltage $V_{DETECT}$ from the leakage detector 122, transmits a voltage control signal CTRL_VOL to the voltage generator 124, transmits a row address X-ADDR to the row decoder 123, and transmits a column address 126Y to the page buffer 126.

The control circuit 125 may perform a program by transmitting, to the voltage generator, the voltage control signal CTRL_VOL indicating the generation of the program voltage fora the data program. The control circuit 125 may sequentially generate the voltage control signal CTRL_VOL indicating generation of a plurality of program voltages for the data program. According to one or more example embodiments, the control circuit 125 may perform a program on the memory block (or page) using an incremental step pulse program (ISPP) scheme. For example, the control circuit 125 may program using a program voltage of a gradually increasing level. The program voltage applied to the word line allows charges to be charged to the floating gate (FG) of each memory cell, and the verification voltage applied to the word line is or corresponds to the voltage that checks whether the amount of charges charged to the floating gate of each target memory cell has been achieved. Hereinafter, a series of sequences for applying a program voltage and a verification voltage to a word line is referred to as a loop. The control circuit (125) may program while performing the loop repeatedly, and the levels of the program voltage and the verification voltage included in the loop may gradually increase as the loop is performed. For example, the control circuit 125 may apply a first program voltage and a first verification voltage to the word line in a first loop, apply a second program voltage and a second verification voltage to the word line in a second loop, and apply a third program voltage and a third verification voltage to the word line in a third loop. In this case, the second program voltage may have a value greater than the first program voltage, and the second verification voltage may have a value greater than the first verification voltage. Likewise, the third program voltage may have a value greater than the second program voltage, and the third verification voltage may have a value greater than the second verification voltage. According to some example embodiments, a difference between the first program voltage and the second program voltage and a difference between the second program voltage and the third program voltage may be the same value.

The page buffer 126 may operate as a write driver and/or a sense amplifier. During a program operation, the page buffer 126 may apply bit line voltages corresponding to data to be programmed to bit lines of the memory cell array 121. During the read operation or the verification operation, the page buffer 126 may detect data stored in the selected memory cell through the bit line BL. Each of a plurality of page buffers (PB) included in the page buffer 126 may be connected to at least one bit line.

Meanwhile, in some example embodiments according to inventive concepts, each memory cell included in the memory cell array 121 may store data of 2 bits or more. For example, the memory cell may be or may include a multi-level cell (MLC) that stores 2-bit data. As another example, the memory cell may be or may include one or more of a triple level cell (TLC) storing 3-bit data or a quadruple level cell (QLC) storing 4-bit data. However, inventive concepts are not limited thereto, and in some example embodiments, some memory cells included in the memory cell array 121 may be single level cells (SLCs) that store 1-bit data, and the remaining memory cells other than some memory cells may be multi-level cells (MLC).

Figure 3:
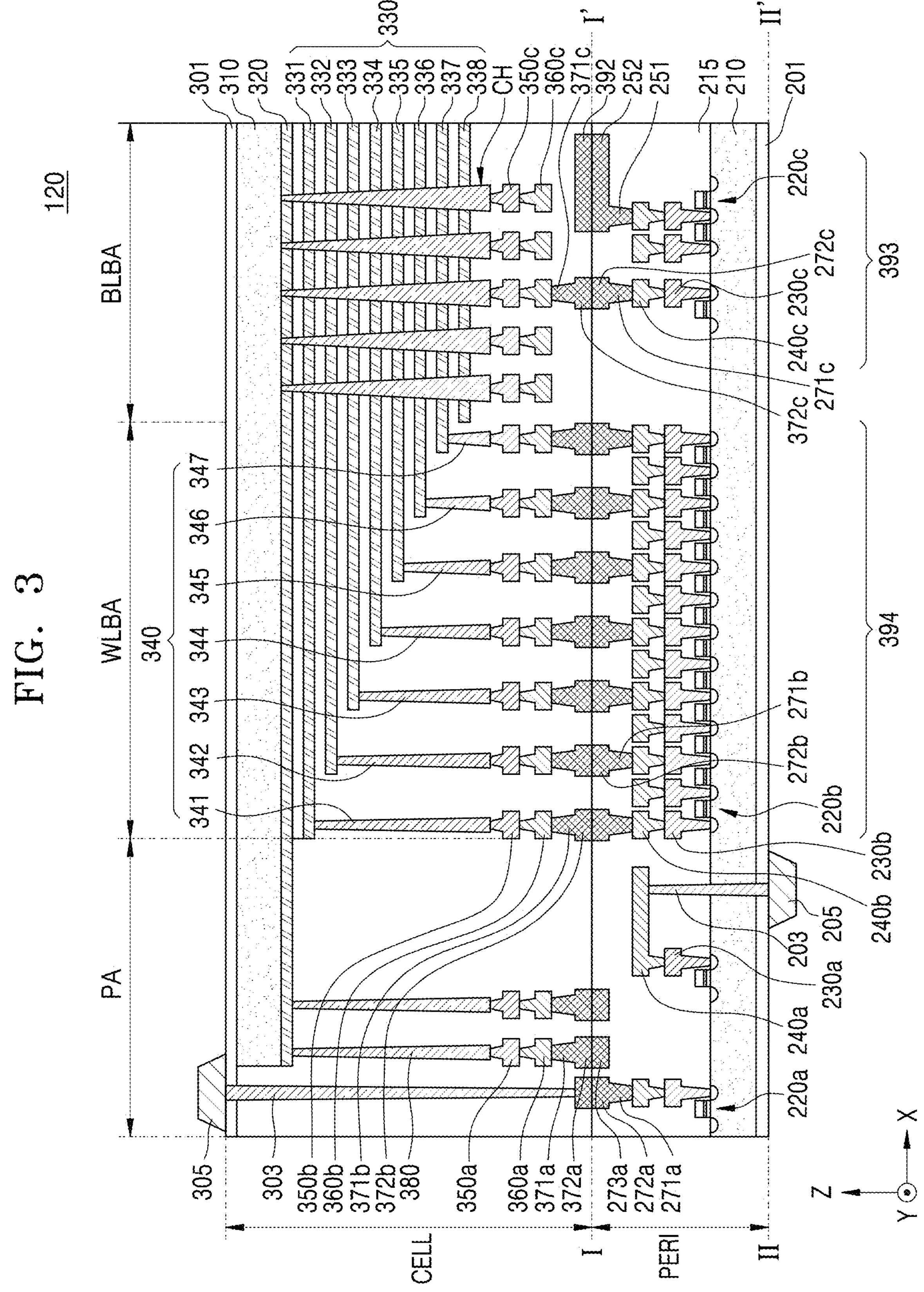
FIG. 3 is a diagram illustrating a structure of a memory device according to some example embodiments.

FIG. 3 is a diagram illustrating a structure of a memory device according to some example embodiments.

Referring to FIG. 3, the memory device 120 may have a chip to chip (C2C) structure. The C2C structure may mean manufacturing an upper chip including a cell area (CELL) on a first wafer, manufacturing a lower chip including a peripheral circuit area (PERI) on a second wafer different from the first wafer, and then connecting the upper chip and the lower chip to each other by bonding. For example, the bonding scheme may refer to a scheme of electrically connecting a bonding metal formed on an uppermost metal layer of the upper chip with a bonding metal formed on an uppermost metal layer of the lower chip. For example, when the bonding metal is formed of copper (Cu), the bonding scheme may be a Cu—Cu bonding scheme, and the bonding metal may be formed of aluminum or tungsten. Example embodiments are not limited thereto.

Each of a peripheral circuit area PERI and a cell area CELL of the memory device 120 may include an external pad bonding area PA, a word line bonding area WLBA, and a bit line bonding area BLBA.

The peripheral circuit area PERI may include a first substrate 210, an interlayer insulating layer 215, a plurality of circuit elements 220*a*, 220*b*, 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* respectively formed on the first metal layers 230*a*, 230*b*, and 230*c*. In some example embodiments, the first metal layers 230*a*, 230*b*, and 230*c* may be formed of tungsten having relatively high resistance, and the second metal layers 240*a*, 240*b*, and 240*c* may be formed of copper having relatively low resistance.

Although only the first metal layers 230*a*, 230*b*, 230*c* and the second metal layers 240*a*, 240*b*, and 240*c* are illustrated and described in this specification, inventive concepts are not limited thereto, and at least one metal layer may be further formed on the second metal layers 240*a*, 240*b*, and 240*c*. At least a part of the at least one metal layer formed on the second metal layers 240*a*, 240*b*, and 240*c* may be made of aluminum having a higher resistance than copper forming the second metal layers 240*a*, 240*b*, and 240*c*.

The interlayer insulating layer 215 is arranged on the first substrate 210 to cover the plurality of circuit element 220*a*, 220*b*, and 220*c*, the first metal layers 230*a*, 230*b*, and 230*c*, and the second metal layers 240*a*, 240*b*, and 240*c*, and may include an insulating material such as one or more of silicon oxide, silicon nitride, or the like.

The lower bonding metals 271*b* and 272*b* may be formed on the second metal layer 240*b* of the word line bonding area WLBA. In the word line bonding area WLBA, the lower bonding metals 271*b* and 272*b* of the peripheral circuit area PERI may be electrically connected to each other by bonding with the upper bonding metals 371*b* and 372*b* of the cell area CELL, and the lower bonding metals 271*b* and 272*b* and the upper bonding metals 371*b* and 372*b* may be made of aluminum, copper, tungsten, or the like.

The cell area CELL may provide at least one memory block. The cell area CELL may include the second substrate 310 and a common source line 320. On the second substrate 310, the plurality of word lines 330, that is, 331 to 338 may be stacked in a direction perpendicular to the top surface of the second substrate 310. String selection lines and ground selection lines may be arranged on the upper and lower portions of the word lines 330, respectively, and the plurality of word lines 330 may be arranged between the string selection lines and the ground selection lines.

In the bit line bonding area BLBA, each of channel structures CH may extend in a direction perpendicular to the top surface of the second substrate 310 to penetrate the word lines 330, the string selection lines, and the ground selection lines. The channel structures CH each may include a data storage layer, a channel layer, a buried insulating layer, and the like, and the channel layer may be electrically connected to a first metal layer 350*c* and a second metal layer 360*c*. For example, the first metal layer 350*c* may be a bit line contact, and the second metal layer 360*c* may be a bit line. In some example embodiments, the bit line 360*c* may extend in a first direction (Y-axis direction) parallel to the top surface of the second substrate 310.

In some example embodiments illustrated in FIG. 3, an area in which the channel structures CH, the bit lines 360*c*, and the like are arranged may be defined as the bit line bonding area BLBA. In the bit line bonding area BLBA, the bit lines 360*c* may be electrically connected to the circuit elements 220*c* that provide the page buffer 393 in the peripheral circuit area PERI. For example, the bit lines 360*c* may be connected to the upper bonding metals 371*c* and 372*c* in the peripheral circuit area PERI, and the upper bonding metals 371*c* and 372*c* may be connected to the lower bonding metals 271*c* and 272*c* connected to the circuit elements 220*c* of the page buffer 393.

In the word line bonding area WLBA, the word lines 330 may extend in a second direction (X-axis direction) parallel to the top surface of the second substrate 310 and may be connected to a plurality of cell contact plugs 340, that is, 341 to 347. The word lines 330 and the cell contact plugs 340 may be connected to each other in pads provided by at least some of the word lines 330 extending in different lengths in the second direction. A first metal layer 350*b* and a second metal layer 360*b* may be sequentially connected to upper portions of the cell contact plugs 340 connected to the word lines 330. The cell contact plugs 340 may be connected to the peripheral circuit area PERI through the upper bonding metals 371*b* and 372*b* of the cell area CELL and the lower bonding metals 271*b* and 272*b* of the peripheral circuit area PERI in the word line bonding area WLBA.

The cell contact plugs 340 may be electrically connected to the circuit elements 220*b* that provide the row decoder 394 in the peripheral circuit area PERI. In one or more example embodiments, the operating voltage of the circuit elements 220*b* providing the row decoder 394 may be different from the operating voltage of the circuit elements 220*c* providing the page buffer 393. For example, the operating voltage of the circuit elements 220*c* providing the page buffer 393 may be greater than the operating voltage of the circuit elements 220*b* providing the row decoder 394.

Common source line contact plugs 380 may be arranged in an outer pad bonding area PA. The common source line contact plugs 380 are formed of a conductive material such as metal, metal compound, or polysilicon, and may be electrically connected to a common source line 320. A first metal layer 350*a* and a second metal layer 360*a* may be sequentially stacked on the common source line contact plug 380. For example, an area in which the common source line contact plugs 380, the first metal layer 350*a*, and the second metal layer 360*a* are arranged may be defined as the external pad bonding area PA.

Meanwhile, input/output pads 205 and 305 may be arranged in the external pad bonding area PA. Referring to FIG. 3, a lower insulating layer 201 covering the bottom surface of the first substrate 210 may be formed under the first substrate 210, and a first input/output pad 205 may be formed on the lower insulating layer 201. The first input/output pad 205 is connected to at least one of the plurality of circuit elements 220*a*, 220*b*, and 220*c* arranged in the peripheral circuit area PERI through a first input/output contact plug 203, and may be separated from the first substrate 210 by the lower insulating layer 201. Alternatively or additionally, a side insulating layer is arranged between the first input/output contact plug 203 and the first substrate 210 to electrically separate the first input/output contact plug 203 from the first substrate 210.

Referring to FIG. 3, an upper insulating layer 301 covering the top surface of the second substrate 310 may be formed on the second substrate 310, and a second input/output pad 305 may be arranged on the upper insulating layer 301. The second input/output pad 305 may be connected to at least one of the plurality of circuit elements 220*a*, 220*b*, and 220*c* arranged in the peripheral circuit area PERI through a second input/output contact plug 303.

According to various example embodiments, the second substrate 310, the common source line 320, and the like may not be arranged in the area where the second input/output contact plug 303 is arranged. Alternatively or additionally, the second input/output pad 305 may not overlap the word lines 330 in the third direction (Z-axis direction). Referring to FIG. 3, the second input/output contact plug 303 may be separated from the second substrate 310 in a direction parallel to the top surface of the second substrate 310, and may be connected to the second input/output pad 305 through the interlayer insulating layer 315 of the cell area CELL.

According to various example embodiments, the first input/output pad 205 and the second input/output pad 305 may be selectively formed. For example, the memory device 120 may include only the first input/output pad 205 arranged above the first substrate 210, or only the second input/output pad 305 arranged above the second substrate 310. Alternatively, the memory device 120 may include both the first input/output pad 205 and the second input/output pad 305.

In each of the external pad bonding area PA and the bit line bonding area BLBA included in each of the cell area CELL and the peripheral circuit area PERI, the metal pattern of the uppermost metal layer may exist as a dummy pattern or the uppermost metal layer may be empty.

The memory device 120 may be configured to form a lower metal pattern 273*a* having the same shape as an upper metal pattern 372*a* of the cell area CELL in the uppermost metal layer of the peripheral circuit area PERI corresponding to the upper metal pattern 372*a* formed in the uppermost metal layer of the cell area CELL in the external pad bonding area PA. The lower metal pattern 273*a* formed on the uppermost metal layer of the peripheral circuit area PERI may not be connected to a separate contact in the peripheral circuit area PERI. Similarly, the upper metal pattern of the same shape as the lower metal pattern of the peripheral circuit area PERI may be formed on the uppermost metal layer of the cell area CELL corresponding to the lower metal pattern formed on the uppermost metal layer of the peripheral circuit area PERI in the outer pad bonding area PA.

The lower bonding metals 271*b* and 272*b* may be formed on the second metal layer 240*b* of the word line bonding area WLBA. In the word line bonding area WLBA, the lower bonding metals 271*b* and 272*b* of the peripheral circuit area PERI may be electrically connected to the upper bonding metals 371*b* and 372*b* of the cell area CELL by a bonding scheme.

Alternatively or additionally, the upper metal pattern 392 of the same shape as the lower metal pattern of the peripheral circuit area PERI may be formed on the uppermost metal layer of the cell area CELL corresponding to the lower metal pattern 252 formed on the uppermost metal layer of the peripheral circuit area PERI in the bit line bonding area BLBA. A contact may not be formed on the upper metal pattern 392 formed on the uppermost metal layer of the cell area CELL.

Figure 4:
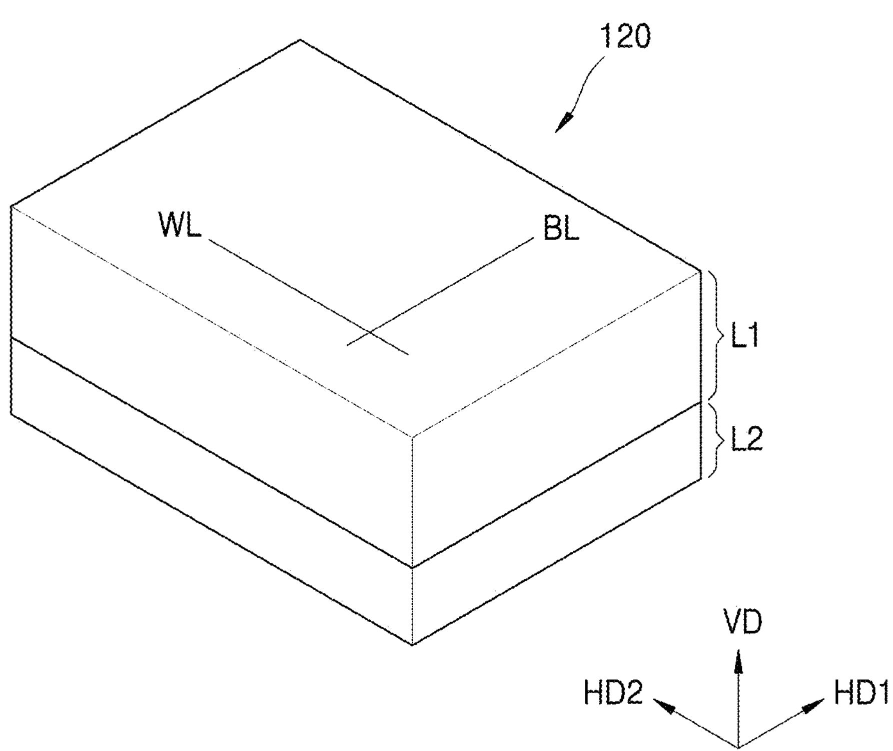
FIG. 4 is a perspective view schematically illustrating a structure of a memory device 120 of FIG. 2, according to some example embodiments.

FIG. 4 is a perspective view schematically illustrating a structure of the memory device 120 of FIG. 2 according to some example embodiments.

Referring to FIG. 4, the memory device 120 may include a first semiconductor layer L1 and a second semiconductor layer L2, and the first semiconductor layer L1 may be stacked in a vertical direction VD with respect to the second semiconductor layer L2. Specifically, the second semiconductor layer L2 may be arranged below the first semiconductor layer L1 in the vertical direction VD, and accordingly, the second semiconductor layer L2 may be arranged close to the substrate. In one or more example embodiments, the memory cell array 121 of FIG. 2 may be formed in the first semiconductor layer L1, and the peripheral circuit of the memory cell array 121 in FIG. 2 may be formed in the second semiconductor layer L2. Accordingly, the memory device 120 may have a structure in which the memory cell array 121 is arranged above the peripheral circuit, for example, a cell over periphery (COP) structure. The COP structure may effectively reduce the horizontal area and improve the degree of integration of the memory device 120.

In one or more example embodiments, the second semiconductor layer L2 may include a substrate, and a peripheral circuit may be formed in the second semiconductor layer L2 by forming transistors and metal patterns for wiring the transistors on the substrate. After the peripheral circuit is formed in the second semiconductor layer L2, the first semiconductor layer L1 including the memory cell array 121 may be formed, and metal patterns for electrically connecting the word lines WL and bit lines BL of the memory cell array 121 with the peripheral circuit formed in the second semiconductor layer L2 may be formed. For example, the bit lines BL may extend in the first horizontal direction HD1, and the word lines WL may extend in the second horizontal direction HD2.

According to the development of the semiconductor process, as the number of stacks of the memory cells arranged in the memory cell array 121 increases, for example, as the number of stacked word lines WL increases, the area of the memory cell array 121 decreases, and accordingly, the area of the peripheral circuit is also reduced.

Figure 5:
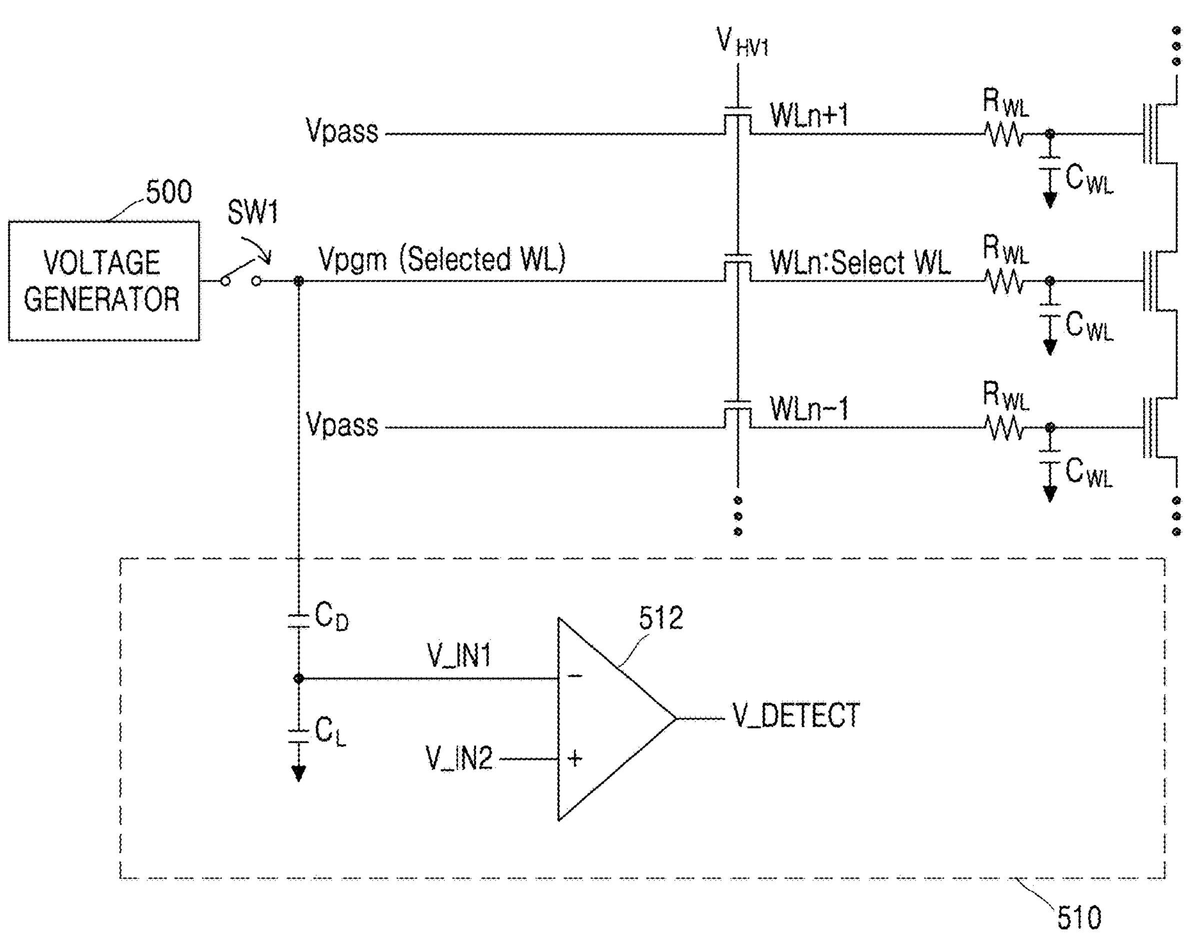
FIG. 5 is a circuit diagram of a leakage detector of a memory device according to some example embodiments.

FIG. 5 is a circuit diagram of a leakage detector of a memory device according to some example embodiments.

Referring to FIG. 5, the leakage detector 510 of the memory device may be connected to each word line. The plurality of word lines may include a selected word line (selected WL) that is a program target, and a non-selective word line that is not a program target. A program voltage V_PGM may be applied to the selected word line selected WL, and a pass voltage V_PASS may be applied to the non-selected word line. When a first switch SW1 is turned on, a leakage detector 510 may detect a leakage occurring in a connected word line using the voltage applied to the word line. The first switch SW1 may be a transistor; however, example embodiments are not limited thereto.

The leakage detector 510 may include a first capacitor CD, a second capacitor CL, a reference voltage generator, and a comparator 512. The reference voltage generator may be or be connected to or be based on the voltage generator 500; however, example embodiments are not limited thereto. The first capacitor CD may be connected to or connectable to the selected word line, and the second capacitor CL, may be connected to the first capacitor and the ground GND. A node between the first capacitor and the second capacitor is a first input voltage node of the comparator 512. A first input voltage V_IN1 is a value in which the program voltage applied to the word line is dropped according to the capacitance ratio of the first capacitor and the second capacitor, and may be calculated as shown in Equation 1 below.

$$V_{IN1} = \frac{C_D}{C_L + C_D} V_{PGM}$$

The reference voltage generator may generate a second input voltage V_IN2 for comparison with the first input voltage. Since the voltage level to be applied by a voltage generator 500 to the selected word line Selected WL is determined, and the capacitance values of the first capacitor CD and the second capacitor CL are also determined, a reference voltage generator may generate an ideal level of voltage and may provide the same to a comparator 512 as a second input voltage.

The comparator 512 may obtain the first input voltage V_IN1 having a value according to Equation 1 and the second input voltage generated V_IN2 by the reference voltage generator. The comparator 512 may determine whether word line leakage occurs by comparing the magnitudes of (e.g., absolute values of) the first input voltage V_IN1 and the second input voltage V_IN2. When a leakage occurs in the word line, a voltage drop (e.g., an IR drop) occurs in the program voltage applied to the word line from the voltage generator 500, and thus the magnitude of the first input voltage V_IN1 may be lowered as compared to the normal case. Since the magnitude of the second input voltage V_IN2 is maintained to be the same, a magnitude difference between the first input voltage and the second input voltage may increase when word line leakage occurs. When a difference in magnitude between the first input voltage and the second input voltage is less than a particular value such as a threshold value, the comparator 512 may determine that word line leakage does not occur or that minimal word line leakage occurs. Conversely, when a difference in magnitude between the first input voltage and the second input voltage is greater than a predetermined value, it may be determined that word line leakage has occurred. The comparator 512 may transmit a detection voltage to the control circuit based on a result of determining whether a word line has leaked.

Figure 6:
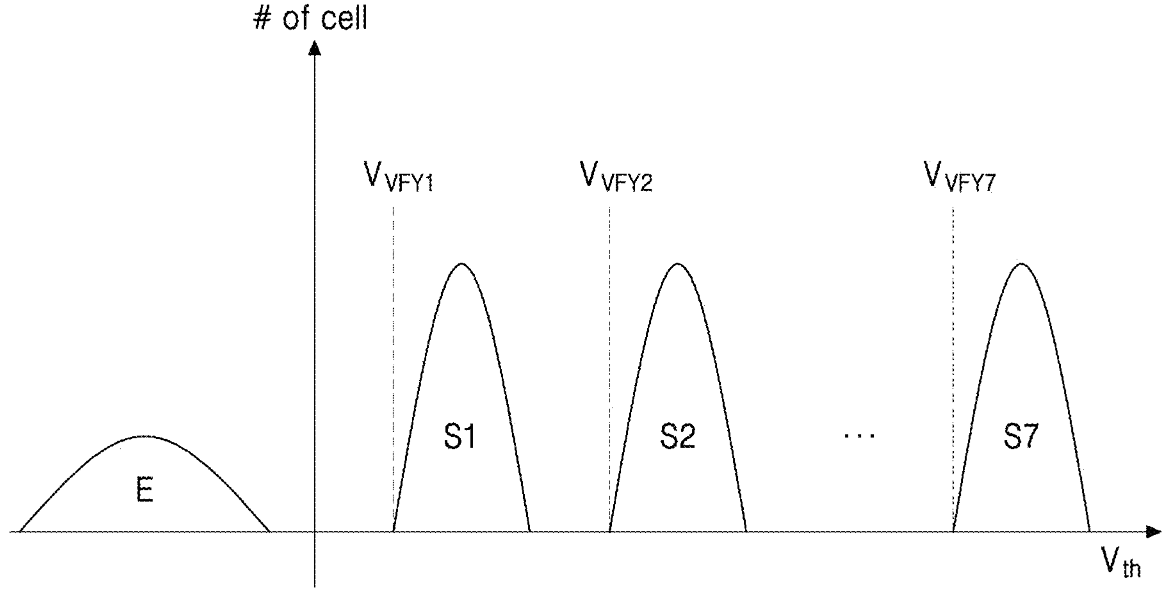
FIG. 6 is a graph illustrating a cell distribution according to data stored in a memory device according to some example embodiments.

FIG. 6 is a graph illustrating a cell distribution according to data stored in a memory device according to some example embodiments.

Referring to FIG. 6, each memory cell may distinguish data according to a level of a threshold voltage. Hereinafter, it is described that 3-bit data, for example, triple level cell (TLC) is stored in each memory cell, but the embodiments of this inventive concept are not limited thereto, and 1-bit data, that is, single level cell (SLC), 2-bit data, that is, multi level cell (MLC), and 4-bit data, that is, quad level cell (QLC) may be stored therein.

Since data consisting of or including or corresponding to three bits may express a total of eight numbers, each memory cell can distinguish eight states with different threshold voltages depending on the amount of charges charged at a floating gate (FG). For example, 111 may correspond to an erase state E in which a threshold voltage is lower than 0 (e.g., 0 volts), 110 may correspond to an S1 state in which the threshold voltage is greater than a first verification voltage $V_{VFY1}$ and less than a second verification voltage $V_{VFY2}$, 101 may correspond to an S2 state in which the threshold voltage is greater than the second verification voltage $V_{VFY2}$ and less than a third verification voltage $V_{VFY3}$, 100 may correspond to an S3 state in which the threshold voltage is greater than the third verification voltage $V_{VFY3}$ and less than a fourth verification voltage $V_{VFY4}$, 011 may correspond to an S4 state in which the threshold voltage is greater than the fourth verification voltage $V_{VFY4}$ and less than a fifth verification voltage $V_{VFY5}$, 010 may correspond to an S5 state in which the threshold voltage is greater than the fifth verification voltage $V_{VFY5}$ and less than a sixth verification voltage $V_{VFY6}$, 001 may correspond to an S6 state in which the threshold voltage is greater than the sixth verification voltage $V_{VFY6}$, and less than a seventh verification voltage $V_{VFY7}$. and 000 may correspond to an S7 state in which the threshold voltage is greater than the seventh verification voltage $V_{VFY7}$ and less than an eighth verification voltage $V_{VFY8}$.

Data is programmed in a page unit, and a program for a plurality of memory cells included in the page is performed according to a voltage level applied to the word line. For example, in the case of a word line, a program voltage V_PGM may be applied to a selected word line, and a pass voltage V_PASS may be applied to a non-selected word line. In the case of the bit line, the ground voltage 0V may be applied to the selected bit line, and the power voltage V_DD may be applied to the non-selected bit lines. The level of the program voltage may gradually increase (e.g., linearly, or in a staircase manner, or in a piece-wise linear manner) as the loop is performed. In each loop, a verification voltage may be applied after a program voltage is applied to a word line. In the case of a cell in which the program voltage is applied and the program is completed, the current does not flow in the string when the verification voltage has been applied, and the corresponding memory cell is in an inhibit state in the subsequent loop. The verification voltage may be or may be based on the minimum threshold voltage of each state. For example, since no current flows in the memory cells mapped to a first state when the first verification voltage $V_{VFY1}$ is applied, the control circuit may determine that the program of the memory cells has been completed.

Figure 7:
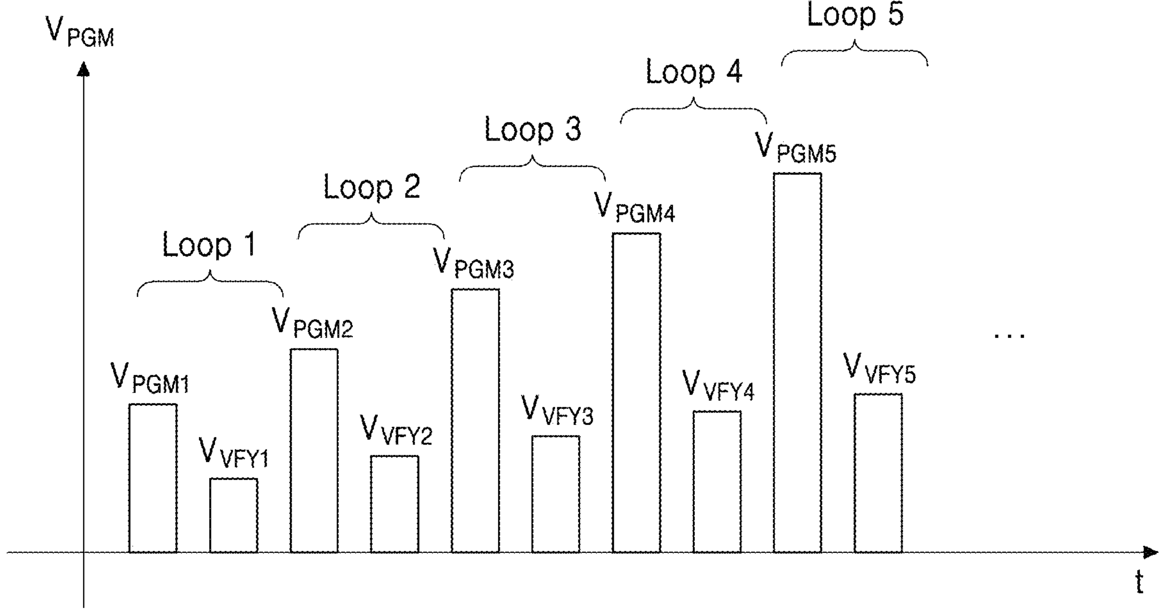
FIG. 7 is a graph illustrating a plurality of program loops performed in a memory device according to some example embodiments.

FIG. 7 is a graph illustrating a plurality of program loops performed in a memory device according to some example embodiments.

Referring to FIG. 7, the control circuit may perform a program operation through a plurality of program loops. The control circuit may control the voltage generator to apply, to each word line, a program voltage and/or a verification voltage of a specified level in each loop. Each loop may include a program section to which a program voltage is applied and a verification section to which a verification voltage is applied. For example, the program loops may include a first loop to which a first program voltage and a first verification voltage are applied, a second loop to which a second program voltage and a second verification voltage are applied, a third loop to which a third program voltage and a third verification voltage are applied, a fourth loop to which a fourth program voltage and a fourth verification voltage are applied, and a fifth loop to which a fifth program voltage and a fifth verification voltage are applied. According to some example embodiments, differences between program voltages applied in adjacent loops may be set to be the same. According to a gradually increasing program voltage, memory cells reaching a target state in a page where a program operation is executed may appear, and the corresponding cells are in an inhibit state after a verification section.

According to some example embodiments, the control circuit may set a number, e.g., a number corresponding to the maximum number of times (e.g., 50N) of execution of the program loop. When the program is not completed even though the loop has been executed up to the maximum number of times of execution, the control circuit may process the block as a bad block. Thus, there may be an improvement in operation of the semiconductor memory device, as there may be an early indication of bad blocks with the word line leakage detection circuit.

Figure 8:
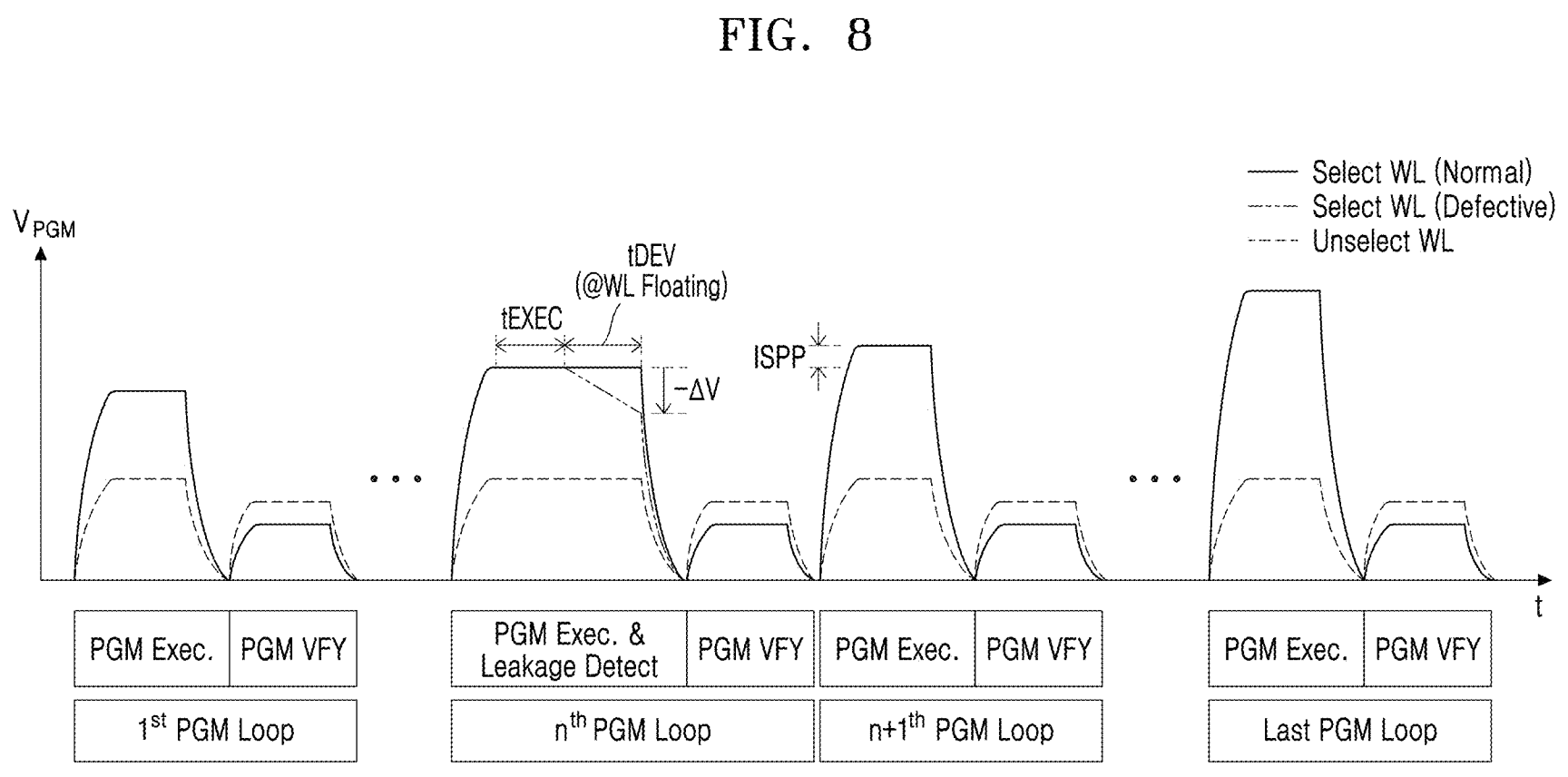

FIG. 8 is a graph illustrating an example in which a memory device according to some example embodiments performs a word line leakage detection operation in a designated loop.

Referring to FIG. 8, the memory device may perform a word line leakage detection operation Leakage Detect in a designated loop during performing a program loop ($1^{st}$ PGM Loop, $n^{th}$ PGM Loop, $(n+1)^{th}$ PGM Loop, Last PGM Loop). The memory device may perform a word line leakage detection operation Leakage Detect using the leakage detector described in FIG. 5. The memory device may perform the word line leakage detection operation Leakage Detect by designating one of a plurality of loops. Hereinafter, a loop in which a word line leakage detection operation Leakage Detect is performed from among a plurality of loops is referred to as an $n^{th}$ PGM loop. According to some example embodiments, the memory device may position the detection loop $n^{th}$ PGM Loop at the beginning of the loop execution. When the detection loop $n^{th}$ PGM Loop is located in the latter part, the program voltage level increases and the leakage voltage increases relatively, which may increase the risk of disturbance. Meanwhile, when the detection loop ($n^{th}$ PGM Loop) is located at the beginning part, leakage may be detected and the loop may be stopped before the program voltage level increases, so even if the word line voltage has dropped, the risk of disturbance is relatively low.

A typical program loop includes a program section PGM Exec. and a verification section PGM VFY, and the program voltage may be applied in the program section PGM Exec. and the verification voltage may be applied in the verification section PGM VFY. In the detection loop ($n^{th}$ PGM Loop), the program section PGM Exec. may include an execution section tEXEC and a development section tDEV. In the execution section tEXEC, the program voltage is normally applied to the word line, and the operation performed in the general program section PGM Exec. is performed. In the development section tDEV, a program voltage may not be applied by floating a word line. When word line leakage does not occur, the voltage level may be maintained even if the program voltage is not supplied to the word line because the word line is insulated from an external word line and a channel hole. Meanwhile, in the event of word line leakage, a voltage drop (−ΔV) occurs in the word line voltage because the program voltage charged in the word line may escape to the external word line and/or channel hole. Accordingly, word line leakage may be detected by using a leakage detector after the development section tDEV.

Referring to FIG. 8, after a precharge section in which a program voltage is charged to a word line, a set program voltage is applied to the word line for a predetermined time, and then the program voltage may not be supplied to the word line. When leakage does not occur in the selected word line, the voltage drop (−ΔV) does not occur even in the development section tDEV, and thus may be programmed normally. However, when leakage occurs in the selected word line, a voltage drop (−ΔV) may occur in the development section tDEV, and the program may not be performed smoothly. In the case of a non-selected word line, a voltage of a level much lower than the program voltage is applied to the word line, so that a program operation may not be performed.

When performing a word line leakage detection operation in the detection loop $n^{th}$ PGM Loop, the program voltage is applied for less time than the time applied in the general program section PGM Exec. Therefore, since the program may not be performed smoothly, the word line leakage detection operation may be performed by selecting one or more loops in the entire loop process.

FIG. 9 is a graph illustrating an example in which a memory device according to some example embodiments performs a word line leakage detection operation in a designated loop.

FIG. 9 illustrates some example embodiments of adjusting the lengths of the execution section tEXEC and the development section tDEV in the detection loop $n^{th}$ PGM Loop. Redundant description of those described in FIG. 8 will be omitted.

The memory device may adjust the lengths of the execution section tEXEC and the development section tDEV in a designated detection loop $n^{th}$ PGM loop. According to some example embodiments, the entire length of the program section PGM Exec. may be fixed according to specifications. Therefore, the memory device may adjust the length ratio of the execution section tEXEC and the development section tDEV within the program section PGM Exec. according to the purpose. Since the execution section (tEXEC) is a section in which the program voltage is applied to the word line, sufficient voltage may be supplied to an area far from the voltage generator within the word line, when the length of the execution section (tEXEC) is increased. However, even if the development section tDEV is shortened and leakage occurs in the word line, sufficient time for occurrence of the voltage drop (−ΔV) may not be guaranteed. Meanwhile, since the development section tDEV is a section in which a program voltage is not supplied to the word line, word line leakage may be more accurately detected when the length of the development section tDEV is increased. However, the length of the execution section tEXEC is shortened, and thus, the program may not be performed normally because the program voltage is not sufficiently supplied to the word line. Alternatively or additionally, it may be difficult to detect the voltage drop (−ΔV) because the voltage is not sufficiently supplied to the word line in the area far from the voltage generator. The memory device may adjust the lengths of the execution section tEXEC and the development section DEV according to a situation.

Referring to FIG. 9, the memory device may reduce the length of the execution section tEXEC and increase the length of the development section tDEV. In this case, the program may not be smooth due to the small amount of time the program voltage is applied to the word line, but when the word line leakage occurs due to the long development section tDEV, more voltage drop (−ΔV) may occur to reliably detect leakage.

According to various example embodiments, the memory device may increase the length of the execution section tEXEC and may reduce the length of the development section tDEV. In this case, the program voltage is sufficiently applied to the word line and the voltage difference between the areas of the word line is reduced, but a sufficient voltage drop (−ΔV) may not occur when the word line leakage occurs due to the short development section tDEV.

According to some example embodiments, the memory device may adjust the level of the second input voltage generated by the reference voltage generator. When the length of the development section tDEV is reduced, the voltage drop (−ΔV) is not sufficiently generated, and thus a difference between the first input voltage and the second input voltage may not be increased. Therefore, when the length of the development section tDEV is reduced, the memory device may increase or decrease the level of the second input voltage so as to detect word line leakage even with a slight difference.

Figure 10:
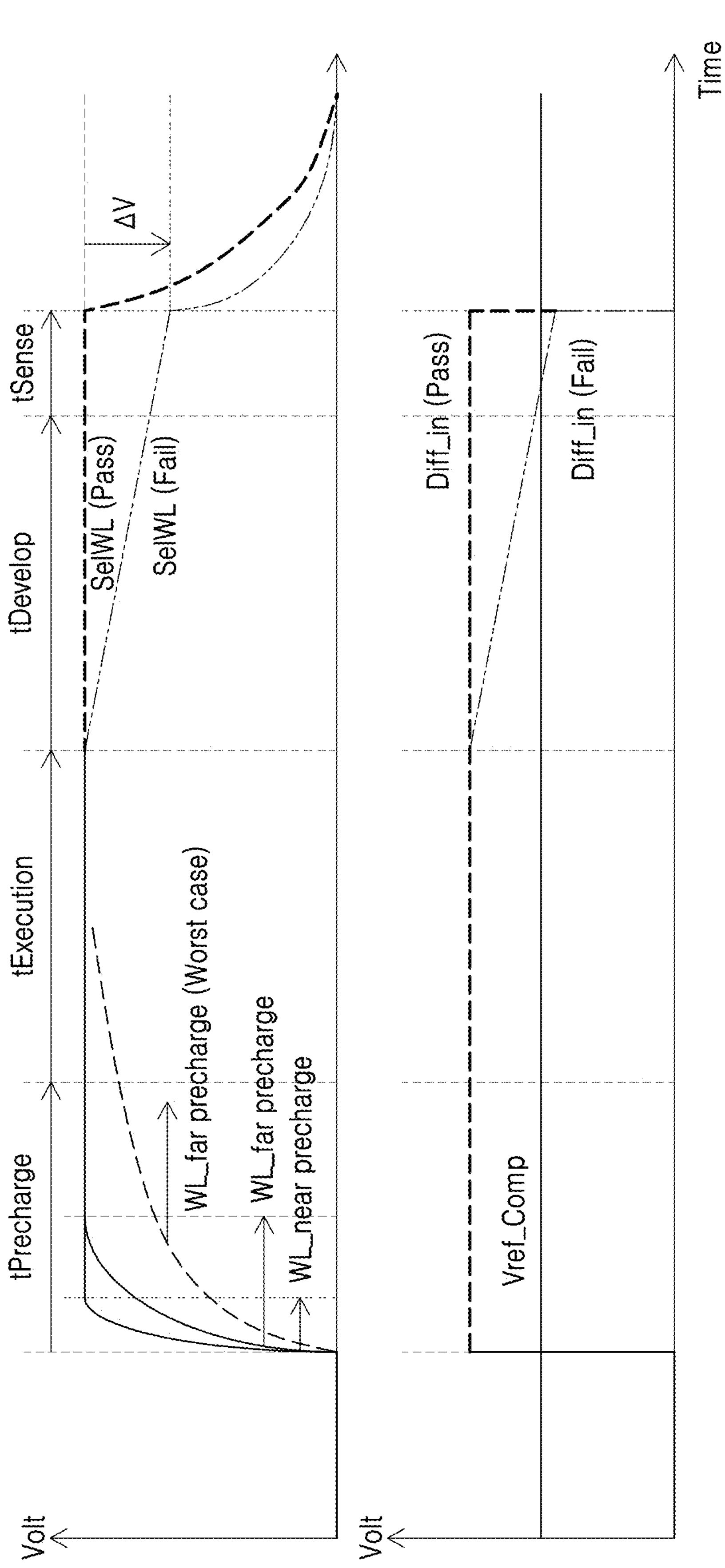
FIG. 10 illustrates graphs of a voltage level charged for each area of a word line when a word line leakage detection operation is performed by a memory device according to some example embodiments.

FIG. 10 illustrates graphs of a voltage level charged for each area of a word line when a word line leakage detection operation is performed by a memory device according to some example embodiments.

According to one or more example embodiments, because the word line is long, voltage may be transmitted to the word line WL_far far from the voltage generator 124 (close to the memory cell array 121) later than the word line WL_near close to the voltage generator 124. Therefore, the accurate leakage detection operation may be performed only when a difference between the two areas WL_far and WL_near is minimized.

Referring to FIG. 10, the program section of the detection loop may include a precharge section tPrecharge, an execution section tExecution, a development section tDevelop, and a sensing section tSense. The precharge section tPrecharge is a time when the program voltage is sufficiently applied to the word line before the execution section tExecution and the development section tDevelop. Voltage is sufficiently supplied to the area WL_near close to the voltage generator in the word line, and voltage rises quickly, but voltage is supplied late to the area WL_far far from the voltage generator, and voltage rises slowly. A program operation using the program voltage is performed in the execution section tExecution, and when the word line is too long, the program voltage may not be sufficiently supplied to even the execution section tExecution. In the development section tDevelop, when word line leakage does not occur in the selected word line selWL, voltage drop (Δ) does not occur (Pass), but qhwn word line leakage occurs, voltage drop (Δ) may occur (Fail). In the sensing section tSense, it is possible to detect that a voltage drop (Δ) has occurred and determine whether a leakage has occurred in a word line.

A lower graph in FIG. 10 is a graph illustrating levels of a first input voltage and a second input voltage input to a comparator of a leakage detector. Since the first input voltage is determined based on the voltage level applied to the word line, when leakage occurs in the word line, the first input voltage decreases from the development section tDevelop. Since the second input voltage is constant, the comparator may compare the first input voltage with the second input voltage and transmit a detection voltage indicating word line leakage to the control circuit when a difference Diff_in between the two input voltages is greater than a predetermined value Vref_Comp.

Figure 11:
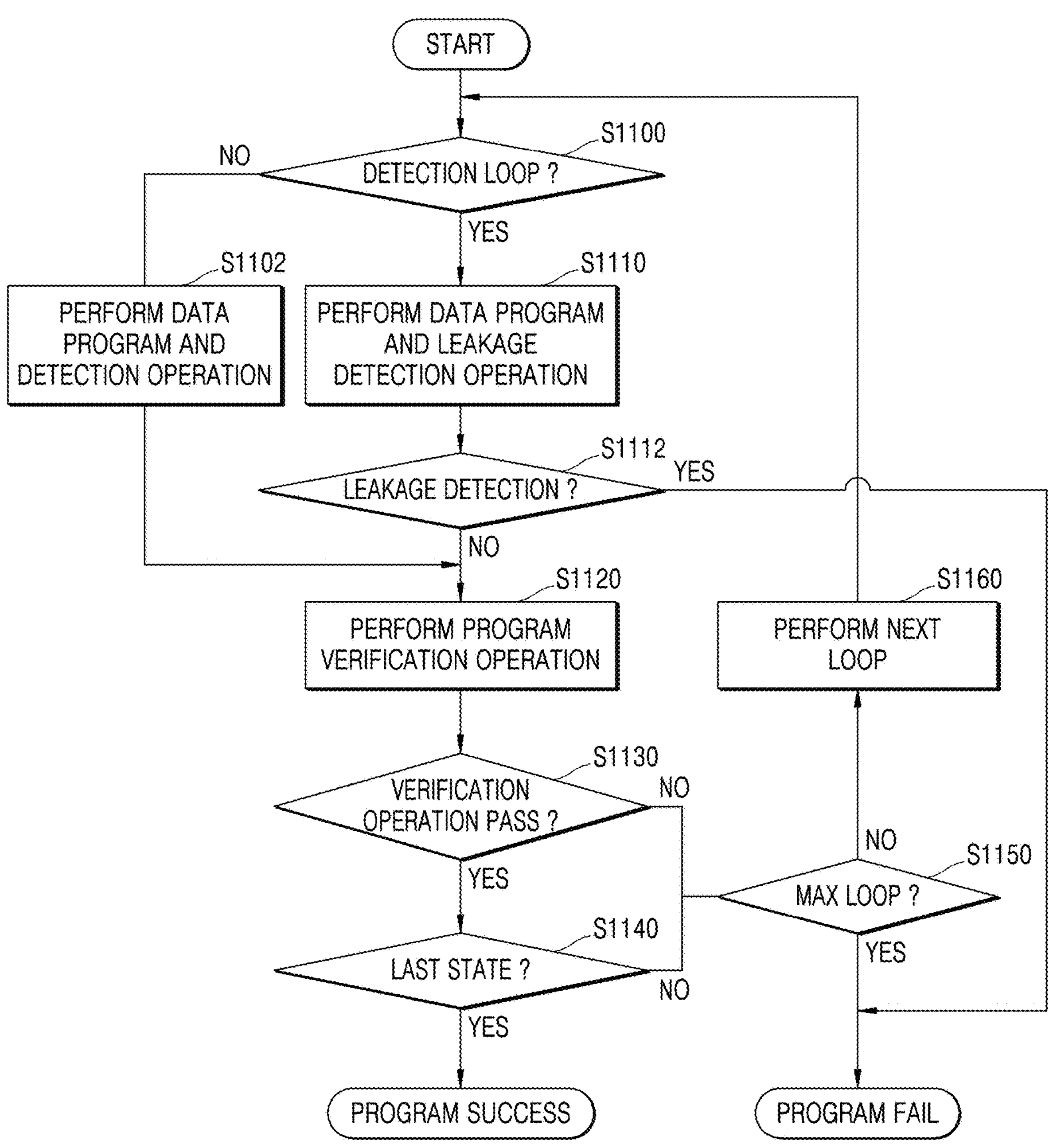
FIG. 11 is a flowchart of a word line leakage detection method of a memory device according to some example embodiments.

FIG. 11 is a flowchart of a word line leakage detection method of a memory device according to some example embodiments.

In operation S1100, the memory device may check whether the current loop is a detection loop. The memory device may determine at least one detection loop from among program loops. According to one or more example embodiments, the memory device may determine one of the initial loops of the program loop as a detection loop to prevent a disturbance risk. When the memory device determines that the current loop is not a detection loop in operation S1100, the memory device may perform a program and verification operation by applying a program voltage and a verification voltage to the word line, in operation S1102.

When the memory device determines that the current loop is a detection loop in operation S1100, the memory device may perform a data program and leakage detection operation in operation S1110. In some example embodiments, since word line leakage detection is performed together with user operation, program and leakage detection operations may be performed simultaneously in the detection loop.

In operation S1112, the memory device may determine whether word line leakage is detected. The memory device may detect word line leakage by comparing the first input voltage based on the word line voltage with the second input voltage generated by the reference voltage generator. When the memory device determines that word line leakage is detected, the memory device determines that the program has failed and may process the block as a bad block. Removing the block as a bad block may help improve operation of the memory device.

When leakage is not detected, the memory device may perform a program verification operation in operation S1120. The verification operation is a procedure for checking whether a program is completed and may be performed by applying an appropriate verification voltage to a word line.

In operation S1130, the memory device may determine whether to pass the verification operation. When the program is normally completed, no current should flow in the memory cell to which the verification voltage is applied. When no current flows, the memory device may determine a cell that has normally completed a program, and if a current flows even though a verification voltage is applied, the memory device may determine a cell that has not yet completed the program. In the case of a verification operation pass, in operation S1140, the memory device may check whether the data currently stored in the memory cell is data in the last state. When the data stored in the current cell is data in the last state, the memory device may determine that the program has been successfully completed and terminate the program. When the data stored in the current cell is not data in the last state in operation S1140 or is not a verification operation pass in operation S1130, the memory device may check whether the current loop is a loop with the maximum number of times of execution in operation S1150. When the current loop is a loop with the maximum number of times of execution, the memory device may determine that the program fails and terminate the loop. When the current loop is not a loop having the maximum number of times of execution in operation S1150, the memory device may perform the next loop in operation S1160.

Figure 12:
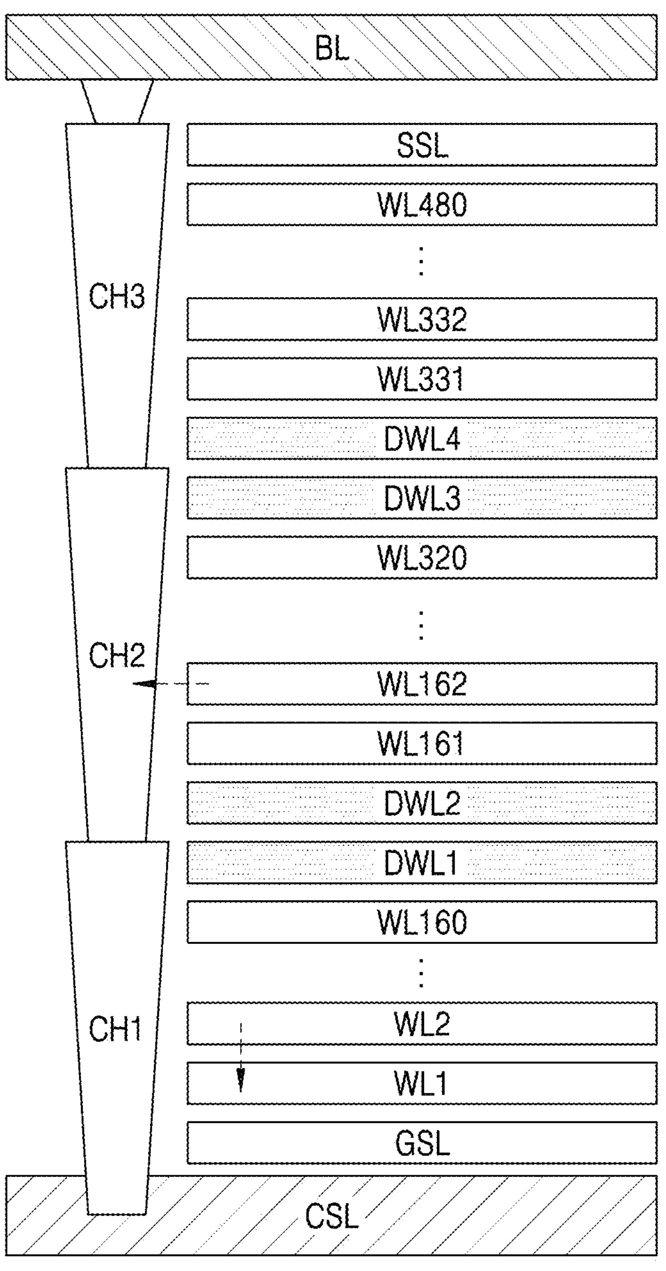
FIG. 12 is a diagram illustrating an arrangement of a plurality of word lines of a memory block according to some example embodiments.

FIG. 12 is a diagram illustrating an arrangement of a plurality of word lines of a memory block according to some example embodiments.

The memory block illustrated in FIG. 12 may be any one of the plurality of memory blocks BLK1 to BLKn described with reference to FIG. 2.

Referring to FIG. 12, a memory block according to some example embodiments may include a bit line BL, a common source line CSL, a plurality of channels CH1 to CH3, a string selection line SSL, a plurality of word lines WL1 to WL480, a plurality of dummy word lines DWL1 to DWL4, and a ground selection line GSL. In this case, the number of the plurality of channels CH1 to CH3, the number of string selection lines SSL, the number of the plurality of word lines WL1 to WL480, the number of the plurality of dummy word lines DWL1 to DWL4, and the number of ground selection lines GSL may be variously modified according to embodiments.

The bit line BL and the common source line CSL may be connected through the plurality of channels CH1 to CH3. The plurality of channels CH1 to CH3 may include a first channel CH1, a second channel CH2, and a third channel CH3, and may pass through the string selection line SSL, the plurality of word lines WL1 to WL480, the plurality of dummy word lines DWL1 to DWL4, and the ground selection line GSL. In this case, the first channel CH1 may pass through the ground selection line GSL, the first to 160th word lines WL1 to WL160 and the first dummy word line DWL1, the second channel CH2 may pass through the second dummy word line DWL2, the 161st to 320th word lines WL161 to WL320, and the third dummy word line DWL3, and the third channel CH3 may pass through the fourth dummy word line DWL4, the 32st1 to 480th word lines WL321 to WL480, and the string selection line SSL.

The string selection line SSL, the plurality of word lines WL1 to WL480, the plurality of dummy word lines DWL1 to DWL4, and the ground selection line GSL may be stacked between the bit line BL and the common source line CSL.

For example, as in the embodiment of FIG. 12, the ground selection line GSL may be stacked at the top of the common source line CSL, the first to 160th word lines WL1 to WL160 may be stacked in order at the top of the ground selection line GSL, and the first dummy word line DWL1 may be stacked at the top of the 160th word line WL160. In addition, the second dummy word line DWL2 may be stacked at the top of the first dummy word line DWL1, the 161st to 320th word lines WL161 to WL320 may be stacked in order at the top of the second dummy word line DWL2, and the third dummy word line DWL3 may be stacked at the top of the 320th word line WL320. In addition, the fourth dummy word line DWL4 may be stacked at the top of the third dummy word line DWL3, the 321st to 480th word lines WL321 to WL480 may be stacked in order at the top of the fourth dummy word line DWL4, and the string selection line SSL may be stacked at the top of the 480th word line WL480.

In this case, when deterioration occurs in the memory device 120, leakage may occur in the plurality of word lines WL1 to WL480. That is, leakage between the word line and the word line or leakage between the word line and the channel in the memory device 120 may occur.

For example, leakage between adjacent word lines may be or may include a current flowing from the second word line WL2 to the first word line WL1 as indicated by a dotted line arrow on the drawing, and leakage between the word line and the channel may be a current flowing from the 162nd word line WL162 to the second channel CH2 as indicated by a dotted line arrow on the drawing. Hereinafter, leakage between adjacent word lines may be referred to as leakage in the first direction, and leakage between the word line and the channel may be referred to as leakage in the second direction.

Figure 13:
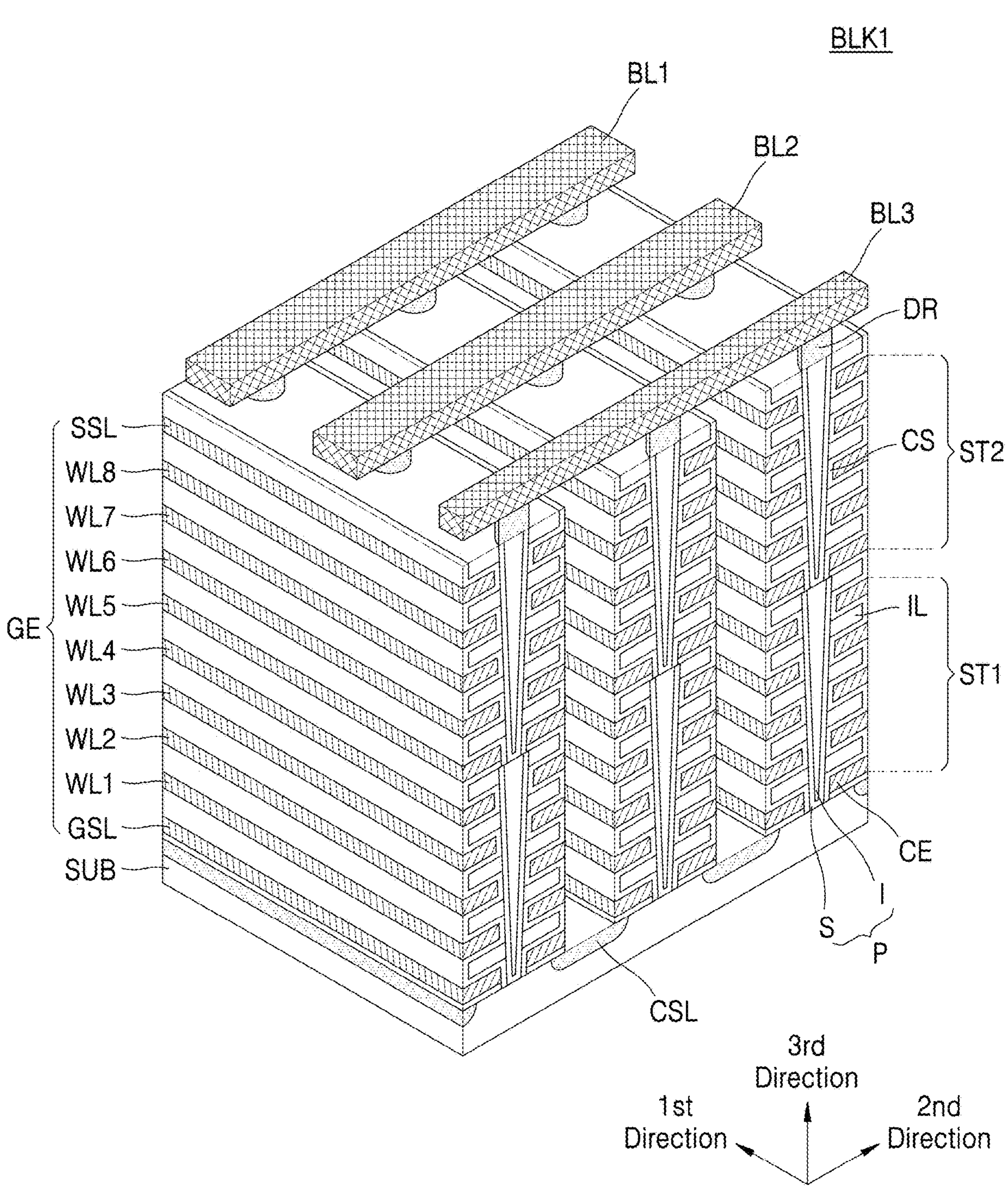
FIG. 13 is a perspective view illustrating a memory block BLK1 according to some example embodiments.

FIG. 13 is a perspective view illustrating a memory block BLK1 according to some example embodiments.

Referring to FIG. 13, each memory block contained in the memory cell array (e.g., 121 in FIG. 2) is formed in a direction perpendicular to the substrate SUB. In FIG. 13, the memory block is shown to include two selection lines GSL and SSL, eight word lines WL1 to WL8, and three bit lines BL1 to BL3, but may actually be more or less than these.

The substrate SUB has a first conductivity type (e.g., p type), extends in the first direction on the substrate SUB, and provides a common source line CSL doped with impurities of the second conductivity type (e.g., n type). The substrate SUB may be a bulk silicon substrate, a silicon-on-insulator (SOI) substrate, a germanium substrate, a germanium-on-insulator (GOI) substrate, a silicon-germanium substrate, or an epitaxial thin layer substrate acquired by performing a selective epitaxial growth (SEG). The substrate SUB may be formed of or include a semiconductor material, and may include, for example, at least one of silicon (Si), germanium (Ge), silicon germanium (SiGe), gallium arsenic (GaAs), indium gallium arsenic (InGaAs), aluminum gallium arsenic (AlGaAs), and a mixture thereof.

A first memory stack ST1 may be provided on the substrate SUB. Specifically, on the area of the substrate SUB between the two adjacent common source lines CSL, a plurality of insulating layers IL extending in the first direction are provided sequentially in the third direction, and the plurality of insulating layers IL are spaced apart by a specific distance in the third direction. For example, the plurality of insulating layers IL may include an insulating material such as silicon oxide. On the area of the substrate SUB between the two adjacent common source lines CSL, a plurality of pillars P are provided due to etching that is sequentially arranged in the first direction and penetrates the plurality of insulating layers IL in the third direction. For example, the plurality of pillars P may penetrate the plurality of insulating layers IL to contact the substrate SUB. For example, the surface layer S of each pillar P may include a silicon material having a first type and may function as a channel area.

Meanwhile, the inner layer I of each pillar P may include an insulating material such as silicon oxide or an air gap.

In the area between the two adjacent common source lines CSL, charge storage layers CS are provided along the exposed surfaces of the insulating layers IL, the pillars P, and the substrate SUB. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. In addition, in the area between the two adjacent common source lines CSL, gate electrodes GE such as selection lines GSL and SSL and word lines WL1 to WL4 are provided on the exposed surfaces of the charge storage layers CS.

The memory block BLK1 according to the technical idea of the inventive concept may be additionally provided with a second memory stack ST2 generated by the same method on the first memory stack ST1 generated by the method described above. Drains or drain contacts DR are provided on the plurality of pillars P extending to the second memory stack ST2, respectively. For example, the drains or the drain contacts DR may include a silicon material doped with impurities having a second conductivity type. Bit lines BL1 to BL3 extending in the second direction and spaced apart by a specific distance in the first direction are provided on the drains DR.

Figure 14:
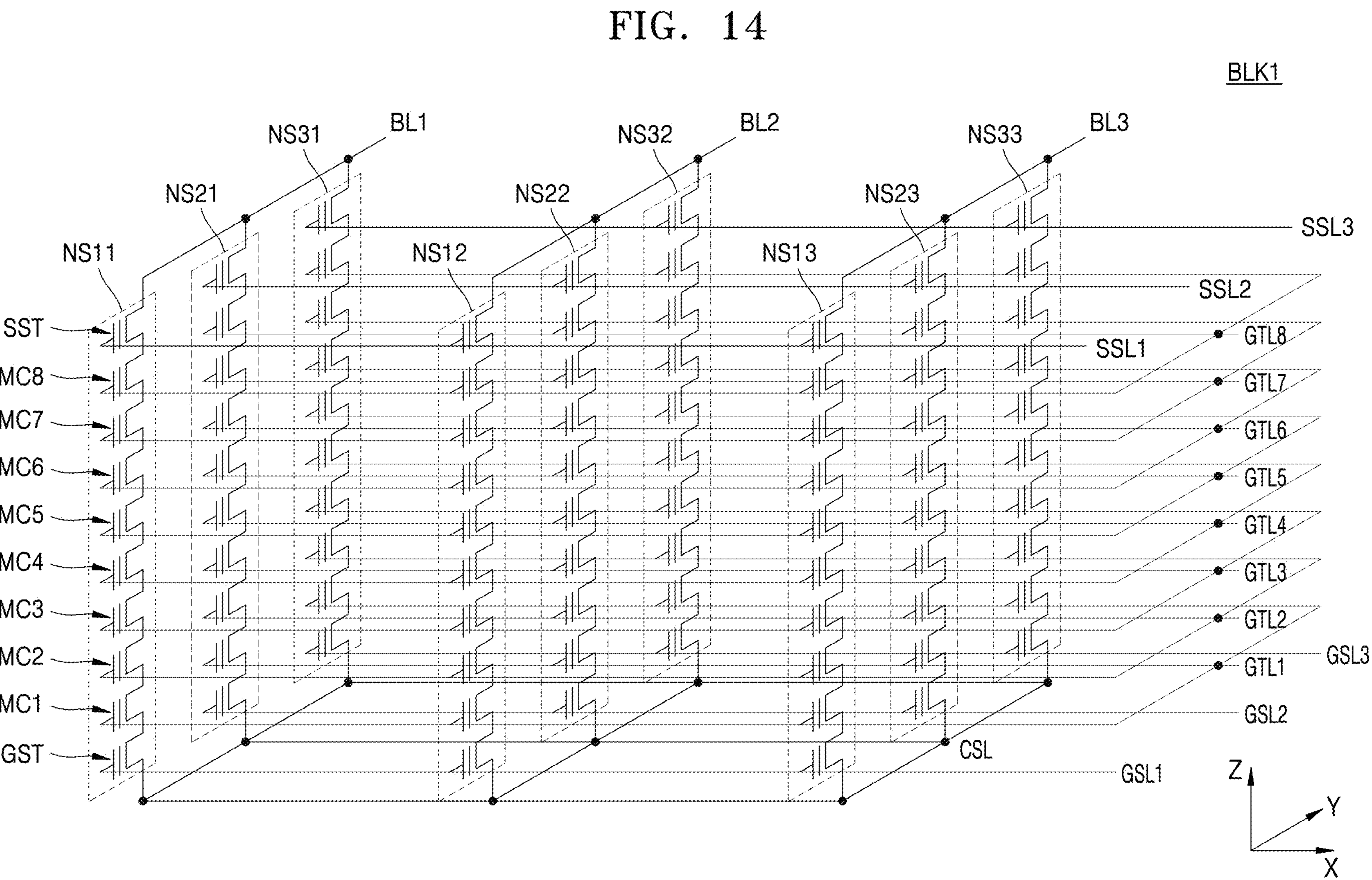
FIG. 14 is a circuit diagram illustrating a memory block of a memory device according to some example embodiments.

FIG. 14 is a circuit diagram illustrating a memory block of a memory device according to some example embodiments.

The memory block illustrated in FIG. 14 is an example of the plurality of memory blocks BLK1 to BLKn described with reference to FIG. 2, and shows a first memory block BLK1. Hereinafter, embodiments of the inventive concept will be described later using the first memory block BLK1 as an example. The first memory block BLK1 represents a 3D memory block formed in a 3D structure on a substrate. A plurality of memory cell strings included in the first memory block BLK1 may be formed in a direction perpendicular to the substrate.

Referring to FIG. 14, the first memory block BLK1 may be a NAND flash memory having a vertical structure, and each of the memory blocks BLK1 to BLKz included in the memory cell array (e.g., 121 of FIG. 2) may be implemented as shown in FIG. 14. The first memory block BLK1 may include a plurality of NAND cell strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of NAND cell strings, the number of word lines, the number of bit lines, the number of ground selection lines, and the number of string selection lines may be variously changed according to embodiments.

NAND cell strings NS11, NS21, and NS31 are provided between the first bit line BL1 and the common source line CSL, NAND cell strings NS12, NS22, and NS32 are provided between the second bit line BL2 and the common source line CSL, and NAND cell strings NS13, NS23, and NS33 are provided between the third bit line BL3 and the common source line CSL. Each NAND cell string (e.g., NS11) may include a string selection transistor SST, a plurality of memory cells MC1 to MC8, and a ground selection transistor GST, which are connected in series.

NAND cell strings commonly connected to one bit line may constitute one column. For example, the NAND cell strings NS11, NS21, and NS31 commonly connected to the first bit line BL1 may correspond to a first column, the NAND cell strings NS12, NS22, and NS32 commonly connected to the second bit line BL2 may correspond to a second column, and the NAND cell strings NS13, NS23, and NS33 commonly connected to the third bit line BL3 may correspond to a third column.

NAND cell strings connected to one string selection line may constitute one row. For example, the NAND cell strings NS11, NS12, and NS13 connected to the first string selection line SSL1 may correspond to a first row, the NAND cell strings NS21, NS22, and NS23 connected to the second string selection line SSL2 may correspond to a second row, and the NAND cell strings NS31, NS32, and NS33 connected to the third string selection line SSL3 may correspond to a third row.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to the corresponding ground selection lines GSL1 to GSL3, and the string selection transistor SST may be connected to the corresponding bit lines BL1 to BL3. The ground selection transistor GST may be connected to the common source line CSL.

In some example embodiments, word lines of the same height (e.g., WL1) are commonly connected, string selection lines SSL1 to SSL3 are separated from each other, and ground selection lines GSL1 to GSL3 are also separated from each other. For example, when memory cells connected to the first word line WL1 and included in the NAND cell strings NS11, NS12, and NS13 corresponding to the first column, are programmed, the first word line WL1 and the first string selection line SSL1 are selected. However, example embodiments are not limited thereto, and in other embodiments, the ground selection lines GSL1 to GSL3 may be connected in common.

Figure 15:
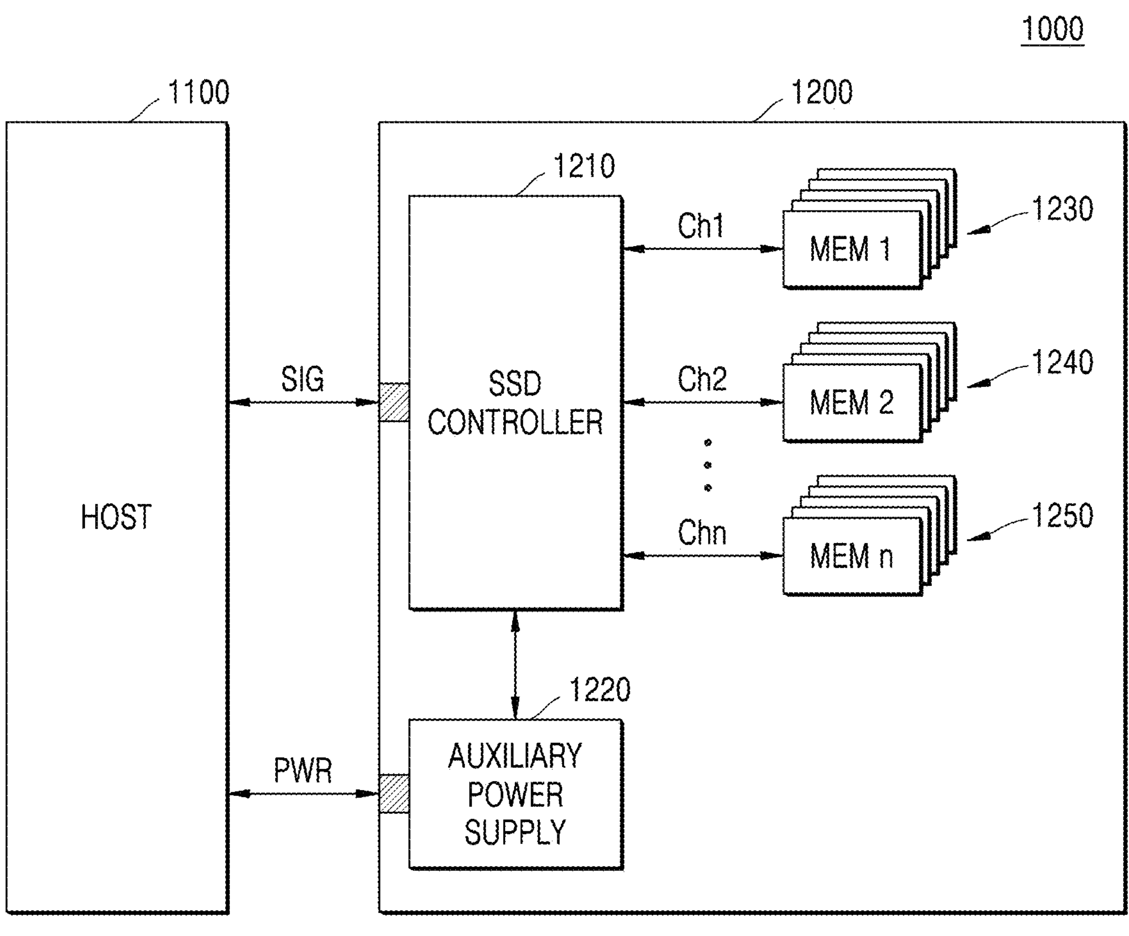
FIG. 15 is a block diagram illustrating an example in which a memory device according to embodiments is applied to a solid state drive (SSD) system.

FIG. 15 is a block diagram illustrating an example in which a memory device according to embodiments is applied to a solid state drive (SSD) system.

Referring to FIG. 15, the SSD system 1000 may include a host 1100 and an SSD 1200. The SSD 1200 may exchange signals with the host 1100 through a signal connector and may receive power through a power connector as an input. The SSD 1200 may include an SSD controller 1210, an auxiliary power supply 1220, and memory devices 1230, 1240, and 1250. The memory devices 1230, 1240, and 1250 may be vertically stacked NAND flash memory devices. In this case, the SSD 1200 may be implemented using the embodiments described above with reference to FIGS. 1 to 14.

As used herein, terms such as processor may refer to or indicate one processor that performs the defined functions, or may refer to or indicate a plurality of processors that collectively perform the defined functions such that the execution of the individual defined functions may be divided amongst such processors.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to various example embodiments thereof, it will be understood that various changes in form and details may be made therein without departing from the spirit and scope of the following claims. Additionally, example embodiments are not necessarily mutually exclusive with one another. For example, some example embodiments may include one or more features described with reference to one or more figures, and may also include one or more features described with reference to one or more other figures.

What is claimed is:

1. A memory device comprising:

a memory cell array including a plurality of word lines;

a voltage generator configured to generate a program voltage and a verification voltage;

a row decoder configured to provide the program voltage and the verification voltage to a designated word line;

a leakage detector connected to each of the plurality of word lines and configured to obtain the program voltage and to perform a leakage detection operation; and a control circuit configured to control the row decoder, the voltage generator, and the leakage detector, and to perform the leakage detection operation on the plurality of word lines, wherein the control circuit is configured to:

execute a loop including a first portion that applies a program voltage to the designated word line and a second portion that applies a verification voltage to the designated word line, wherein in the loop, the program voltage applied to the designated word line gradually increases;

control the program voltage not to stop being applied to the designated word line after a time in the first portion, in response to execution of at least one designated loop;

use the leakage detector to measure an analog voltage charged in the designated word line after the second portion of the designated loop is terminated; and use the leakage detector to perform the leakage detection operation based on the measured analog voltage.

2. The memory device of claim 1, wherein the leakage detector comprises a first capacitor, a second capacitor connected in series with the first capacitor, a reference voltage generator, and a comparator, and wherein the comparator is configured to:

compare a magnitude of a first input voltage in which an acquired program voltage is dropped based on a capacitance ratio of the first capacitor and the second capacitor, with a magnitude of a second input voltage input from the reference voltage generator; and transmit a detection voltage indicating whether to detect leakage to the control circuit, based on a difference between the magnitude of the first input voltage and the magnitude of the second input voltage.

3. The memory device of claim 2, wherein the control circuit is configured to, receive the detection voltage to determine whether the designated word line has leaked, and terminate the loop and determine a program failure, in response to detecting leakage in the word line.

4. The memory device of claim 2, wherein the control circuit is configured to, adjust a ratio of a time corresponding to a program voltage being applied to the word line in the first portion of the designated loop and a time corresponding to a program voltage not being applied to the word line in the first portion of the designated loop.

5. The memory device of claim 4, wherein the control circuit is configured to set the time of the program voltage not being applied to the word line to be longer than the time the program voltage being applied to the word line, in the first portion of the designated loop.

6. The memory device of claim 4, wherein the control circuit is configured to set a time of a program voltage being applied to the word line to be longer than a time of a program voltage not being applied to the word line, in the first portion of the designated loop.

7. The memory device of claim 6, wherein in response to the time of a program voltage being applied to the word line is set to be longer than the time of a program voltage not being applied to the word line in a first period of the designated loop, the control circuit is configured to generate a second input voltage having a level lower than a value, in the reference voltage generator.

8. The memory device of claim 2, wherein the control circuit is configured to:

in the second portion of the loop, apply the verification voltage to the word line, execute a next loop when current flows to a bit line of a target cell, and terminate the loop when current does not flow to the bit line of the target cell and determine a program success.

9. The memory device of claim 8, wherein the control circuit is configured to:

set a value corresponding to a maximum number of times of execution of the loop, determine that a leakage has occurred in response to verification not being completed in the second portion of the loop of the value, and determine a program failure.

10. The memory device of claim 2, wherein the control circuit is configured to set to increase a length of the first portion of the loop.

11. A word line operating method of a memory device including a plurality of word lines, the method comprising:

executing a loop including a first portion that applies a program voltage to the word lines and a second portion that applies a verification voltage to the word lines, wherein in the loop the program voltage applied to the word lines gradually increases;

controlling the program voltage not to be applied to the word lines after a time in the first portion, in response to execution of a designated loop;

using a leakage detector to measure an analog voltage charged in the word lines after the second portion of the designated loop is terminated, by using the leakage detector; and performing a leakage detection operation based on the measured analog voltage.

12. The method of claim 11, wherein the performing of the leakage detection operation comprises:

comparing a magnitude of a first input voltage in which a program voltage is dropped based on a capacitance ratio of a first capacitor and a second capacitor, with a magnitude of a second input voltage input from a reference voltage generator; and determining whether to detect leakage, based on a difference between the magnitude of the first input voltage and the magnitude of the second input voltage.

13. The method of claim 12, wherein the performing of the leakage detection operation comprises terminating the loop and determining a program failure in response to detecting leakage in the word lines.

14. The method of claim 12, wherein the performing of the leakage detection operation comprises:

adjusting a ratio of a time when a program voltage is applied to the word lines and a time when the program voltage is not applied to the word lines in the first portion of the designated loop.

15. The method of claim 14, wherein the performing of the leakage detection operation comprises performing the loop by setting the time when a program voltage is not applied to the word lines to be longer than the time when a program voltage is applied to the word lines, in the first portion of the designated loop.

16. The method of claim 14, wherein the performing of the leakage detection operation comprises performing the loop by setting the time when a program voltage is applied to the word lines to be longer than the time when a program voltage is not applied to the word lines, in the first portion of the designated loop.

17. The method of claim 16, wherein the performing of the leakage detection operation comprises:

when the time of a program voltage being applied to the word lines is set to be longer than a time of a program voltage not being applied to the word lines in a first period of the designated loop, using the voltage generator to generate a second input voltage having a level lower than a first value.

18. A memory system comprising:

a memory device including a memory cell array including a plurality of word lines, a voltage generator configured to generate a program voltage and a verification voltage, a row decoder configured to provide the program voltage and the verification voltage to a designated word line, and a leakage detector connected to each of the plurality of word lines and configured to perform a leakage detection operation by obtaining the program voltage; and a memory controller configured to transmit, to the memory device, a command indicating an operation of the memory device, wherein the memory device is configured to:

execute a loop including a first portion that applies a program voltage to the designated word line and a second portion that applies a verification voltage to the designated word line, wherein in the loops, the program voltage applied to the designated word line gradually increases; and control the program voltage not to be applied to the designated word line after a time in the first portion, in response to execution of a designated loop use the leakage detector to measure an analog voltage charged in the designated word line after the second portion of the designated loop is terminated, and to perform a leakage detection operation based on the measured analog voltage.

19. The memory system of claim 18, wherein the leakage detector comprises a first capacitor, a second capacitor connected in series with the first capacitor, a reference voltage generator, and a comparator, wherein the comparator is configured to:

compare a magnitude of a first input voltage in which an acquired program voltage is dropped based on a capacitance ratio of the first capacitor and the second capacitor, with a magnitude of a second input voltage input from the reference voltage generator; and transmit a detection voltage indicating whether to detect leakage to the control circuit, based on a difference between the magnitude of the first input voltage and the magnitude of the second input voltage.

20. The memory system of claim 18, wherein the memory device is configured to adjust lengths of a time of the program voltage being applied to the word line and a time of the program voltage not being applied to the word line, in the first portion of the designated loop.

* * * * *